US010790384B2

(12) United States Patent
Beninger-Bina et al.

(10) Patent No.: US 10,790,384 B2
(45) Date of Patent: Sep. 29, 2020

(54) POWER SEMICONDUCTOR DEVICE HAVING OVERVOLTAGE PROTECTION

(71) Applicant: Infineon Technologies Austria AG, Villach (AT)

(72) Inventors: Markus Beninger-Bina, Grosshelfendorf (DE); Thomas Basler, Riemerling (DE); Matteo Dainese, Villach (AT); Hans-Joachim Schulze, Taufkirchen (DE)

(73) Assignee: Infineon Technologies Austria AG (AT)

( * ) Notice: Subject to any disclaimer, the term of this patent is extended or adjusted under 35 U.S.C. 154(b) by 0 days.

(21) Appl. No.: 16/402,712

(22) Filed: May 3, 2019

(65) Prior Publication Data

US 2019/0259863 A1 Aug. 22, 2019

Related U.S. Application Data

(63) Continuation of application No. 15/926,131, filed on Mar. 20, 2018, now Pat. No. 10,355,116.

(30) Foreign Application Priority Data

Mar. 20, 2017 (DE) .................. 10 2017 105 895
Aug. 18, 2017 (DE) .................. 10 2017 118 863

(51) Int. Cl.
*H01L 29/73* (2006.01)
*H01L 29/04* (2006.01)
(Continued)

(52) U.S. Cl.
CPC ...... *H01L 29/7395* (2013.01); *H01L 27/0255* (2013.01); *H01L 27/0727* (2013.01);
(Continued)

(58) Field of Classification Search
CPC ... H01L 29/7395; H01L 29/04; H01L 29/083; H01L 29/1095; H01L 29/32; H01L 29/36;
(Continued)

(56) References Cited

U.S. PATENT DOCUMENTS 2,895,109 A 7/1959 Weinreich
4,620,211 A 10/1986 Baliga et al.
(Continued)

FOREIGN PATENT DOCUMENTS

DE 3738670 C2 6/1994
DE 19958694 A1 6/2001
(Continued)

*Primary Examiner* — Ida M Soward
(74) *Attorney, Agent, or Firm* — Design IP

(57) ABSTRACT

A chip includes a semiconductor body coupled to a first and a second load terminal. The semiconductor body includes an active region including a plurality of breakthrough cells, each of the breakthrough cells includes: an insulation structure; a drift region; an anode region, the anode region being electrically connected to the first load terminal and disposed in contact with the first load terminal; a first barrier region arranged in contact with each of the anode region and the insulation structure, where the first barrier region of the plurality of breakthrough cells forms a contiguous semiconductor layer; a second barrier region separating each of the anode region and at least a part of the first barrier region from the drift region; and a doped contact region arranged in contact with the second load terminal, where the drift region is positioned between the second barrier region and the doped contact region.

20 Claims, 25 Drawing Sheets

(51) Int. Cl.
| | |
|---|---|
| *H01L 29/08* | (2006.01) |
| *H01L 29/10* | (2006.01) |
| *H01L 29/32* | (2006.01) |
| *H01L 29/36* | (2006.01) |
| *H01L 29/423* | (2006.01) |
| *H01L 29/66* | (2006.01) |
| *H01L 29/80* | (2006.01) |
| *H01L 27/07* | (2006.01) |
| *H01L 29/739* | (2006.01) |
| *H01L 29/808* | (2006.01) |
| *H01L 27/02* | (2006.01) |
| *H01L 29/861* | (2006.01) |
| *H01L 29/74* | (2006.01) |
| *H01L 29/16* | (2006.01) |

(52) U.S. Cl.
CPC ............ *H01L 29/04* (2013.01); *H01L 29/083* (2013.01); *H01L 29/1095* (2013.01); *H01L 29/32* (2013.01); *H01L 29/36* (2013.01); *H01L 29/423* (2013.01); *H01L 29/66348* (2013.01); *H01L 29/7397* (2013.01); *H01L 29/8083* (2013.01); *H01L 29/861* (2013.01); H01L 29/0834 (2013.01); H01L 29/16 (2013.01); H01L 29/66325 (2013.01); H01L 29/7393 (2013.01); H01L 29/7398 (2013.01); H01L 29/7428 (2013.01); H01L 2924/13055 (2013.01)

(58) Field of Classification Search
CPC ............ H01L 29/423; H01L 29/66348; H01L 29/7397; H01L 29/8083; H01L 29/861; H01L 27/0522; H01L 27/0725; H01L 27/0727
See application file for complete search history.

(56) References Cited

U.S. PATENT DOCUMENTS

| | | | |
|---|---|---|---|
| 4,972,239 A | 11/1990 | Mihara | |
| 5,221,857 A * | 6/1993 | Kano | H01L 21/28525 257/510 |
| 6,031,254 A | 2/2000 | Quoirin | |
| 6,353,236 B1 | 3/2002 | Yatsuo | |
| 6,864,535 B2 | 3/2005 | Tihanyi | |
| 8,080,459 B2 * | 12/2011 | Xu | H01L 29/66719 438/270 |
| 8,274,137 B2 | 9/2012 | Yamaguchi | |
| 8,450,777 B2 | 5/2013 | Rahimo | |
| 8,896,027 B2 * | 11/2014 | Terano | H01L 29/205 257/183 |
| 9,209,109 B2 | 12/2015 | Werber et al. | |
| 9,391,135 B1 | 7/2016 | Grivna et al. | |
| 9,659,929 B2 * | 5/2017 | Weis | H01L 27/0883 |
| 9,966,277 B2 * | 5/2018 | Zundel | H01L 23/49838 |
| 10,319,819 B2 * | 6/2019 | Shimizu | H01L 29/045 |
| 2002/0088991 A1 | 7/2002 | Hisamoto | |
| 2006/0170036 A1 | 8/2006 | Yilmaz | |
| 2009/0032851 A1 | 2/2009 | Pfirsch et al. | |
| 2012/0043582 A1 | 2/2012 | Koyama et al. | |
| 2014/0327072 A1 | 11/2014 | Nishii et al. | |
| 2016/0064551 A1 | 3/2016 | Lee et al. | |
| 2016/0307993 A1 | 10/2016 | Kuribayashi | |

FOREIGN PATENT DOCUMENTS

| | | |
|---|---|---|
| DE | 10261424 B3 | 7/2004 |
| DE | 102007036147 A1 | 3/2009 |
| DE | 102009049051 A1 | 4/2010 |
| DE | 102011081029 B4 | 8/2015 |
| EP | 694960 B1 | 7/2002 |
| JP | S63177473 A | 7/1988 |
| JP | 2000091596 A | 3/2000 |
| JP | 2010004003 A | 1/2010 |
| JP | 2011503889 A | 1/2011 |
| WO | 2016010097 A1 | 1/2016 |

* cited by examiner

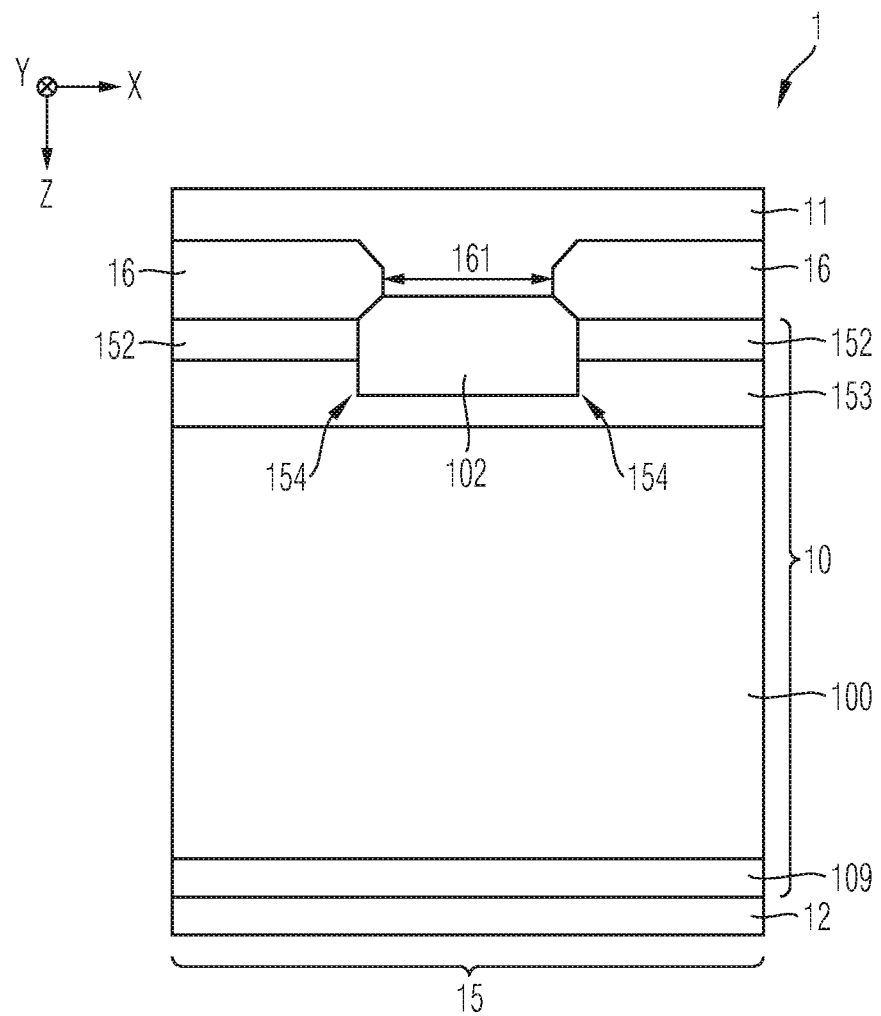

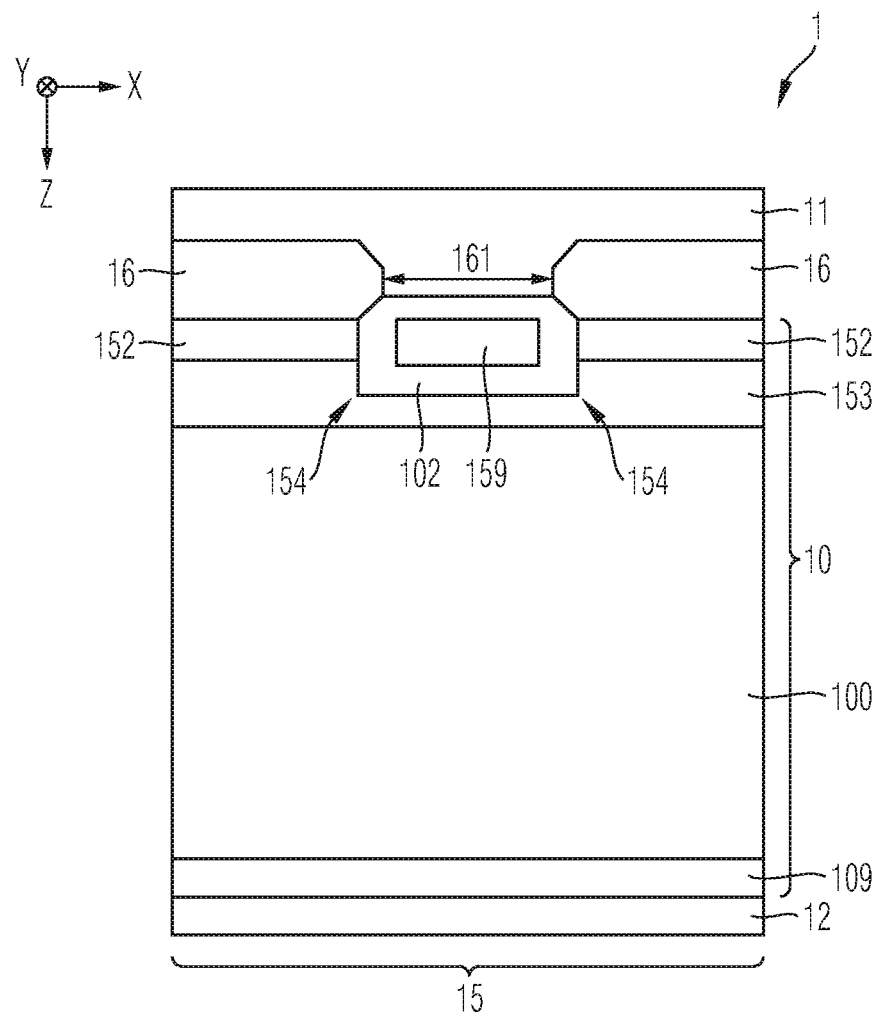

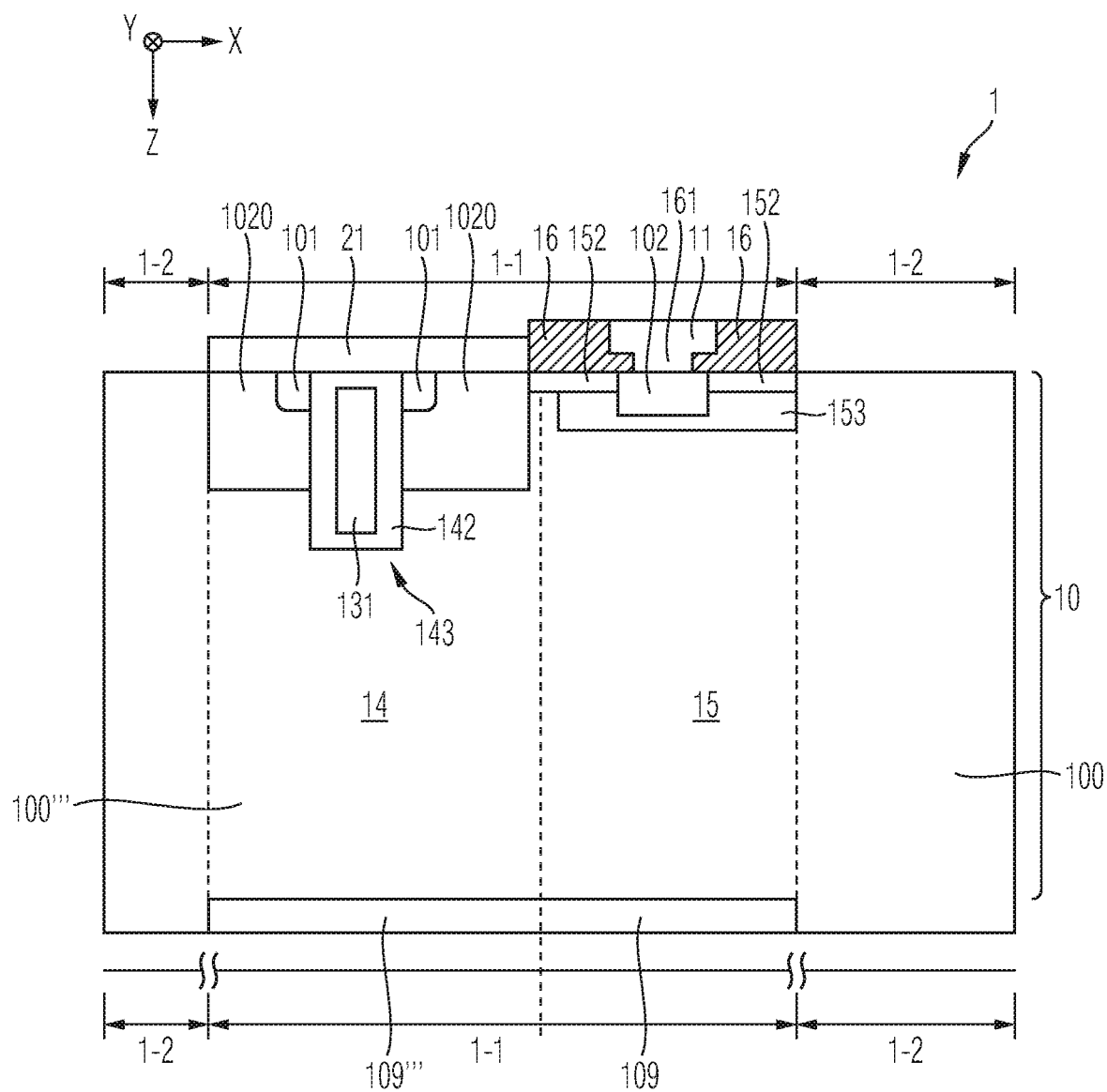

POWER SEMICONDUCTOR DEVICE HAVING OVERVOLTAGE PROTECTION

CROSS-REFERENCE TO RELATED APPLICATIONS

This application is a continuation of U.S. patent application Ser. No. 15/926,131 filed Mar. 20, 2018, which claims the benefit of German Patent Application No. 102017105895.8 filed Mar. 20, 2017 and German Patent Application No. 102017118863.0 filed Aug. 18, 2017, which are incorporated by reference as if fully set forth.

FIELD

This specification refers to embodiments of a power semiconductor device and to embodiments of a method of processing a power semiconductor device. In particular, this specification refers to aspects of a overvoltage protection power semiconductor chip and to embodiments of a power semiconductor device switch, as well as to embodiments of corresponding processing methods.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device. Further, the load current path may be controlled by means of an insulated electrode, sometimes referred to as gate electrode. For example, upon receiving a corresponding control signal from, e.g., a driver unit, the control electrode may set the power semiconductor device in one of a conducting state and a blocking state. In some cases, the gate electrode may be included within a trench of the power semiconductor switch, wherein the trench may exhibit, e.g., a stripe configuration or a needle configuration.

It is usually desirable to keep losses, e.g., switching losses, on-state losses during a conducting state and off-state losses during a blocking state of the power semiconductor device low.

Further, a power semiconductor device may be designed to continuously operate under nominal conditions, according to which, e.g., a load current does normally not exceed a nominal value for more than a predetermined time period, and a voltage applied between the two load terminals does normally not exceed a nominal value for more than a predetermined time period.

It is usually tried to avoid that the power semiconductor device becomes subjected to a voltage significantly higher than the nominal blocking voltage it has been designed for, regarding transient state (e.g., switching) situations as well as continuous blocking state situations. To this end, some overvoltage protection concepts have been developed in the past, one of which is generally known as "clamping". For example, a so-called Transient Voltage Suppressor Diode (TVS Diode) can be used in order to reduce transient overvoltages that may occur during a transistor switching operation.

SUMMARY

Aspects described herein relate to (without being limited thereto) to a semiconductor structure having a pnp-configuration with the p-doped sections being electrically connected to a respective load terminal. The p-doped section being electrically connected to a first one of the load terminals, referred to as "first doped region" herein, may optionally include at least a portion of a recombination zone. For example, the first doped region can be an anode region, e.g., an anode region of an overvoltage protection power semiconductor chip. Or, the first doped region can be a body region, e.g., a body region of a power semiconductor switch.

According to an embodiment, power semiconductor device includes a semiconductor body coupled to a first load terminal and a second load terminal. The semiconductor body includes: a first doped region of a second conductivity type electrically connected to the first load terminal; an emitter region of the second conductivity type electrically connected to the second load terminal; a drift region of a first conductivity type and arranged between the first doped region and the emitter region. The drift region and the first doped region enable the power semiconductor device to be operated in: a conducting state during which a load current between the load terminals is conducted along a forward direction; in a forward blocking state during which a forward voltage applied between the terminals is blocked; and in a reverse blocking state during which a reverse voltage applied between the terminals is blocked. The semiconductor body further includes a recombination zone arranged at least within the first doped region.

According to another embodiment, a method of processing a power semiconductor device is presented. The semiconductor device includes a semiconductor body coupled to a first load terminal and a second load terminal. The semiconductor body includes: a first doped region of a second conductivity type electrically connected to the first load terminal; an emitter region of the second conductivity type electrically connected to the second load terminal; a drift region of a first conductivity type and arranged between the first doped region and the emitter region. The drift region and the first doped region enable the power semiconductor device to be operated in: a conducting state during which a load current between the load terminals is conducted along a forward direction; in a forward blocking state during which a forward voltage applied between the terminals is blocked; and in a reverse blocking state during which a reverse voltage applied between the terminals is blocked. The method includes: forming, in the semiconductor body, a recombination zone arranged at least within the first doped region.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIGS. 2A-2B each schematically and exemplarily illustrate a section of a vertical cross-section of power semiconductor device in accordance with some embodiments;

FIG. 14 schematically and exemplarily illustrates a section of a vertical cross-section of a power semiconductor device including a transistor cell in accordance with one or more embodiments;

DETAILED DESCRIPTION

Figure 1:
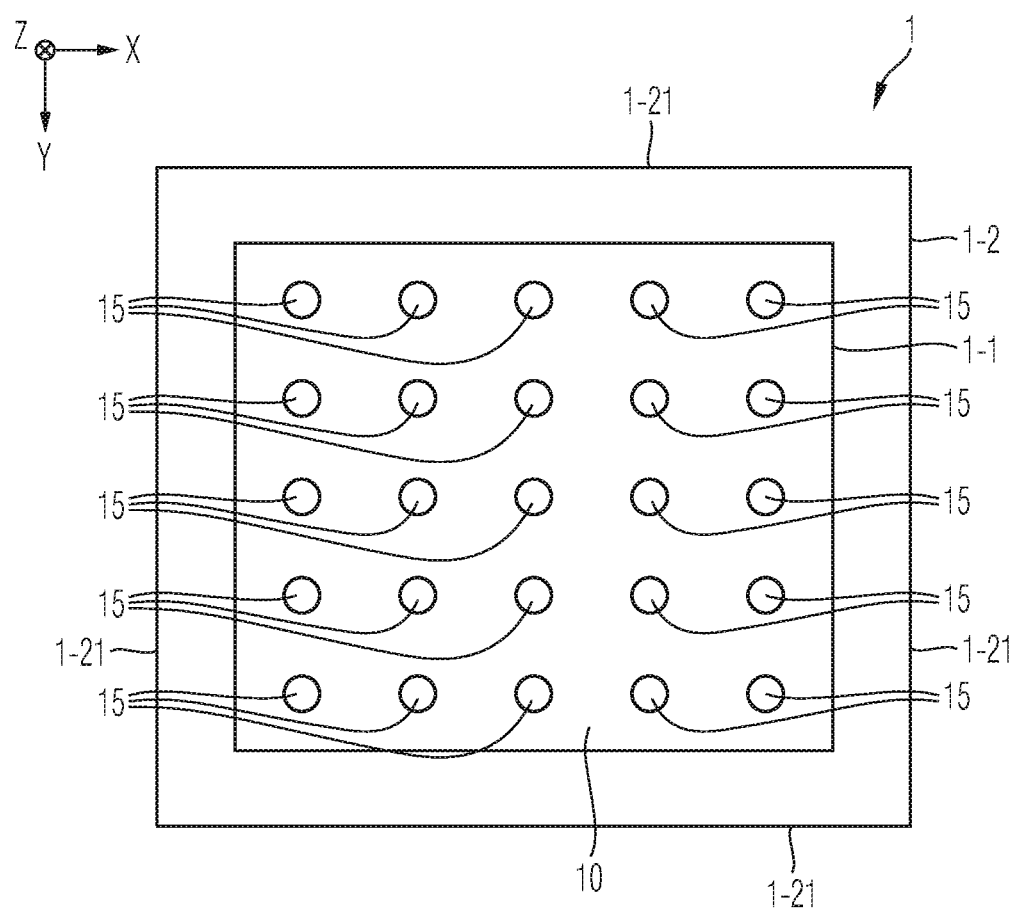
FIG. 1 schematically and exemplarily illustrates a section of a horizontal projection of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor switch exhibiting a stripe cell or cellular cell configuration, e.g., a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more active power semiconductor cells, such as a monolithically integrated diode cell, e.g., monolithically integrated cell of two anti-serially connected diodes, a monolithically integrated transistor cell, e.g., a monolithically integrated IGBT cell and/or derivatives thereof. Such diode/transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V or even more, e.g., up to at least 3 kV.

For example, the power semiconductor device described below may be a semiconductor device exhibiting a stripe cell configuration or a cellular (columnar) cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

Figure 22:
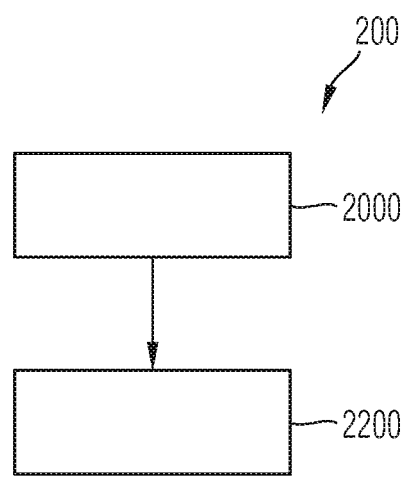
FIG. 22 schematically and exemplarily illustrates a method in accordance with one or more embodiments.
Figure 23:
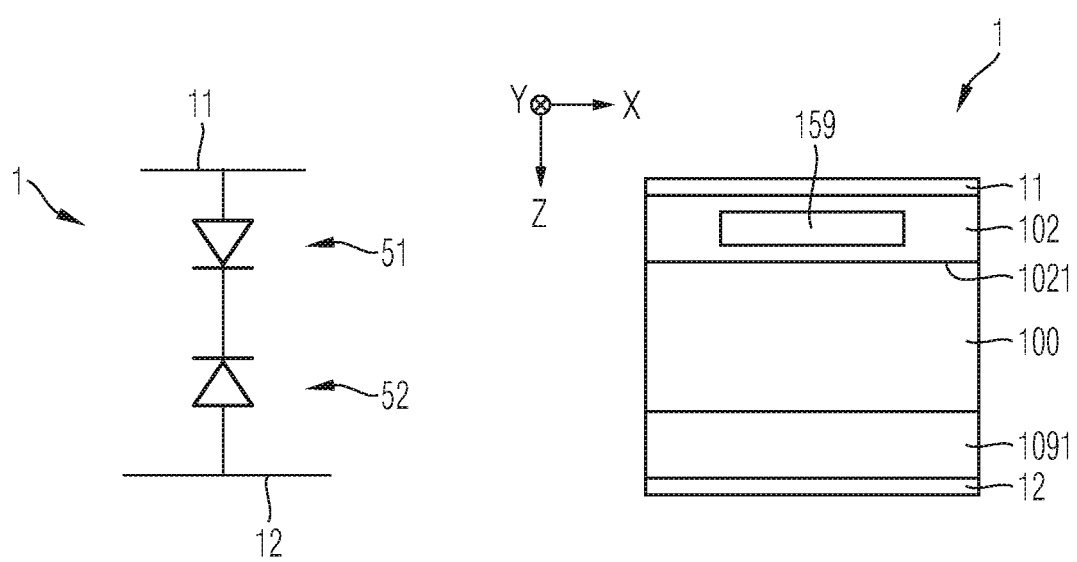
FIG. 23 schematically and exemplarily illustrates a section of a vertical cross-section of a power semiconductor device together with an electrically equivalent circuit diagram in accordance with one or more embodiments.

FIG. 23 schematically and exemplarily illustrates a power semiconductor device 1 together with an electrically equivalent circuit diagram in accordance with some embodiments. The power semiconductor device 1 can for example be implemented as a power semiconductor switch (as exemplarily explained with respect to FIGS. 17A-22) or as an overvoltage protection power semiconductor chip (as exemplarily explained with respect to FIGS. 1 to 16).

Hence, it shall be understood that everything of what is described in the following with respect to FIG. 23 may equally apply to all the embodiments described with respect to the other drawings.

The power semiconductor device 1 comprises a semiconductor body 10 coupled to a first load terminal 11 (e.g., an emitter terminal, an anode terminal or a source terminal) and a second load terminal 12 (e.g., a collector terminal or a drain terminal). The semiconductor body 10 includes: a first doped region 102 (herein also referred to as body region 102 or anode region 102) of the second conductivity type electrically connected to the first load terminal 11; an emitter region 1091 of the second conductivity type electrically connected to the second load terminal 12; and a drift region 100 of the first conductivity type and arranged between the first doped region 102 and the emitter region 1091; where the drift region 100 and the first doped region 102 enable the power semiconductor device 1 to be operated in: a conducting state during which a load current between the load terminals 11, 12 is conducted along a forward direction; in a forward blocking state during which a forward voltage applied between the terminals 11, 12 is blocked; and in a reverse blocking state during which a reverse voltage applied between the terminals 11, 12 is blocked.

The semiconductor body 10 may optionally further comprise a recombination zone 159 arranged at least within the first doped region 102.

For example, as illustrated in the equivalent circuit, a transition from the first doped region 102 to the drift region 100 forms a first diode 51, and a transition from the emitter region 1091 to the drift region 100 forms a second diode 52. The first diode 51 and the second diode 52 are connected anti-serially with each other.

For example, the first diode 51 exhibits a first breakthrough voltage, and the second diode 52 exhibits a second breakthrough voltage, wherein the first breakthrough voltage is at least five times as great as the second breakthrough voltage. This factor can be even greater than five, e.g., amount to at least ten, 100 or even more than 1000. For example, the second breakthrough voltage may be greater than 10 V, greater than 50 V, e.g., greater than 10 V and less than 100 V. E.g., the first breakthrough voltage is about 80 times greater than the second breakthrough voltage, hence, e.g. based on the values above, within the range of 800 V to 8 kV. A typical example would be 20 V for the second and 1600 V for the first breakthrough voltage.

For example, each of the first load terminal 11, the first doped region 102, the recombination zone 159, the drift region 100, the emitter region 1091 and the second load terminal 12 exhibit a common lateral extension range, e.g., along the first lateral direction X, e.g., of at least 500 nm, at least 2000 nm, or even more than 6000 nm.

Further, the recombination zone 159 can be is configured to reduce at least one of a lifetime and a mobility of charge carriers present within the recombination zone 159.

As will be explained in more detail below, the recombination zone 159 may be laterally structured.

As will also be explained in more detail below, the power semiconductor device 1 can be configured to induce a conduction channel 103 within the first doped region 102 for conduction of at least a part of the load current during the conducting state, wherein the induced conduction channel 103 and the recombination zone 159 are spatially separated from each other. E.g., a minimum distance between the recombination zone and the induced conduction channel amounts to at least 50 nm.

Further, the recombination zone 159 can be arranged such that it does not extend into the drift region 100.

In an embodiment, the recombination zone 159 exhibits a crystal defect concentration at least 1000 times greater than a crystal defect concentration within the drift region 100.

In an embodiment, the first doped region 102 extends deeper into the semiconductor body 10 than the recombination zone 159.

As will become more apparent from the description further below, the first load terminal 11 may comprises a contact groove (cf. reference numerals 161 in FIG. 2 and 111 in FIG. 19A) that interfaces with the first doped region 102, wherein the recombination zone 159 laterally overlaps with the contact groove and exhibits lateral dimensions within the range of 60% to 200% of the lateral dimensions of the contact groove.

Further the power semiconductor device 1 can comprise a plurality of cells (e.g., transistor cells (cf. reference numeral 14 in FIGS. 12 and 13)) each configured to be operated in said conducting state, said forward blocking state and said reverse blocking state.

The recombination zone 159 can be designed such that it is spatially separated from a location of a peak of an electric field during the forward blocking state.

In an embodiment, the recombination zone 159 can exhibit crystal defects that form a plurality of recombination centers within the recombination zone 159. E.g., the crystal defects are temperature-stable up to a temperature of at least 360°. A crystal defect concentration of the recombination zone may vary along at least the first lateral direction X by a factor of at least two.

Figure 19A:
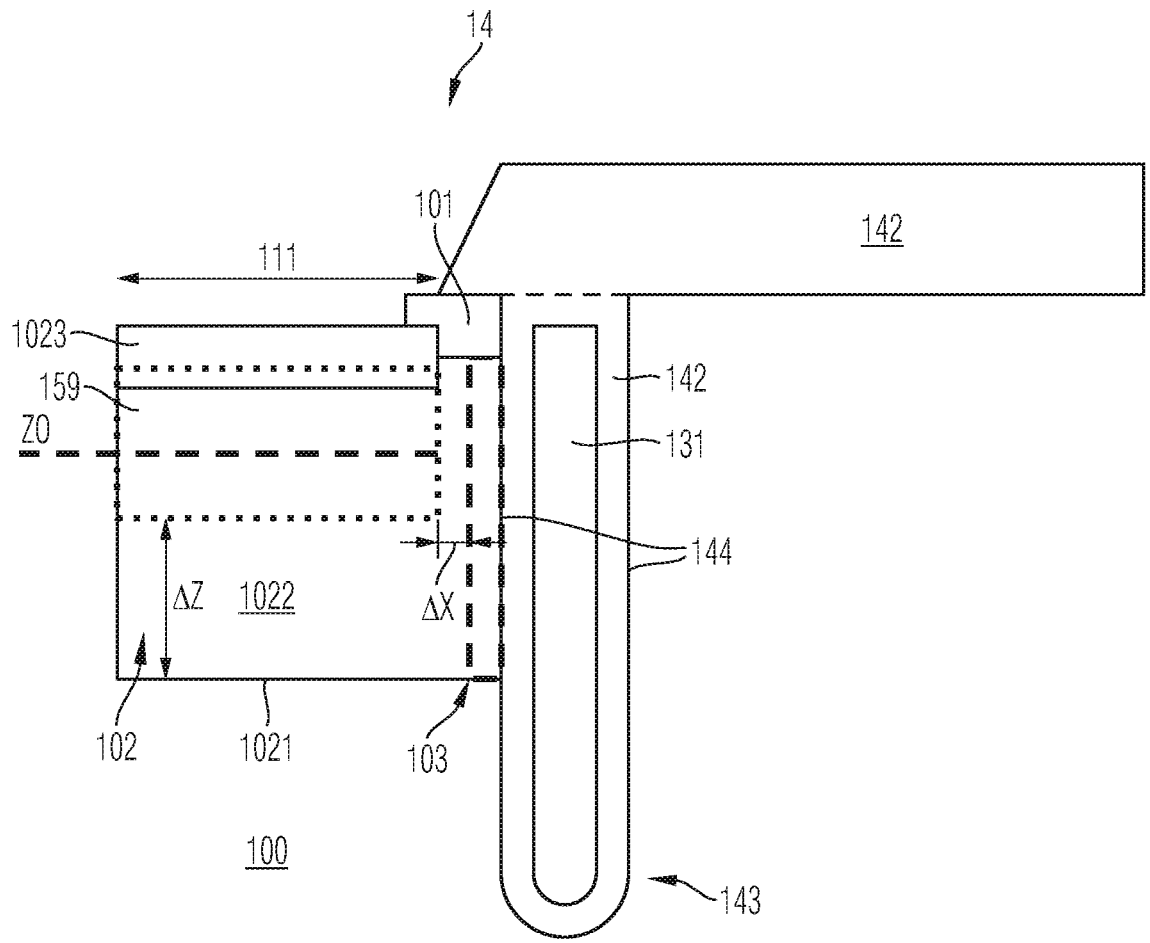
FIG. 19A schematically and exemplarily illustrates a section of a vertical cross-section of a power semiconductor device in accordance with one or more embodiments.

As will become more apparent from the description of FIG. 19A, the first doped region 102 can exhibit a first subsection (cf. FIG. 19A, reference numeral 1023) and a second subsection (cf. FIG. 19A, reference numeral 1022), the first subsection interfacing with the first load terminal 11 and having a higher dopant concentration than the second subsection, the second subsection interfacing with the drift region 100, wherein the recombination zone 159 extends into each of the first and second subsection. Further, a peak of the crystal defect concentration can be located within an upper half of the second subsection or within a lower half of the first subsection of the first doped region 102.

In an embodiment, the semiconductor body 10 interfaces with the second load terminal 12 exclusively by means of the emitter region 1091.

As will become more apparent from the description below, the semiconductor body 10 may further comprise a field stop region 1092, wherein the field stop region 1092 terminates the drift region 100 and exhibits a proton-irradiation induced dopant concentration of dopants of the first conductivity type that is greater than the drift region dopant concentration.

The power semiconductor device 1 can be, as indicated above, a power semiconductor switch and may further comprise a source region (cf. reference numeral 101 in FIG. 17A) of the first conductivity type and electrically connected to the first load terminal 11, wherein the first doped region 102 separates the source region 101 from the drift region 100. E.g., the recombination zone 159 extends into source region 101.

In an embodiment, the power semiconductor device 1 comprises an active region (cf. reference numeral 1-1 in FIG. 1) and an inactive edge region 1-2 surrounding the active region 1-1. For example, the recombination zone 159 does not extend into the inactive edge region 1-2.

Further, in an example, the active region 1-1 can comprises a plurality of cells (e.g., transistor cells 14), wherein the recombination zone 159 is laterally structured in that: only each of a share of the plurality of cells (e.g. transistor cells 14) includes the recombination zone 159; and/or the recombination zone 159 is laterally structured within a horizontal cross-section of at least one of the plurality of the cells (e.g., transistor cells).

As will also become more apparent from the description below, the power semiconductor device 1 may further comprise: a first barrier region 152 (cf. FIG. 2A) of the second conductivity type at a lower dopant concentration than the first doped region 102 and arranged in contact with both the first doped region 102 and an insulation structure 16, 142; and a second barrier 153 region of the first conductivity type at a higher dopant concentration than the drift region 100 and separating both the first doped region 102 and at least a part of the first barrier region 152 from the drift region 100. For example, at least one of the first barrier region 152 and the second barrier region 153 forms a contiguous semiconductor layer within the active region 1-1 (cf. FIG. 24).

Herein presented is also a method of processing a power semiconductor device. The semiconductor device comprises a semiconductor body coupled to a first load terminal and a second load terminal. The semiconductor body comprises: a first doped region of a second conductivity type electrically connected to the first load terminal; an emitter region of the second conductivity type electrically connected to the second load terminal; a drift region of a first conductivity type and arranged between the first doped region and the emitter region. The drift region and the first doped region enable the power semiconductor device to be operated in: a conducting state during which a load current between the load terminals is conducted along a forward direction; in a forward blocking state during which a forward voltage applied between the terminals is blocked; and in a reverse blocking state during which a reverse voltage applied between the terminals is blocked. The method comprises: Forming, in the semiconductor body, a recombination zone arranged at least within the first doped region.

Exemplary embodiments of the method may correspond to the exemplary embodiments of the device described above. Further optional aspects of the method will be described in more detail below.

As has been introductorily explained, the power semiconductor device 1 described herein, e.g., as above with respect to FIG. 23, may for example be implemented as a power semiconductor switch or as an overvoltage protection power semiconductor chip.

The following description of FIGS. 1 to 16 and 24 to 25A-B primarily relates to the case where the power semiconductor device 1 is implemented as an overvoltage protection power semiconductor chip (the introductorily mentioned "first exemplary subgroup of embodiments"), and the following description of FIGS. 17A to 22 primarily relates to the case where the power semiconductor device 1 is implemented as a power semiconductor switch (the introductorily mentioned "second exemplary subgroup of embodiments").

Within the description of FIGS. 1 to 22, 24 and 25A-B, optional features of the components of the power semiconductor device 1 will be explained, in particular optional features of the first doped region 102. It shall be understood that these optional features may a) equally apply to the devices FIGS. 1 to 22, 24 and 25A-B irrespective of whether the respective device is implemented as power semiconductor switch or as an overvoltage protection power semiconductor chip and b) equally apply to the device in accordance with FIG. 23 described above.

Power Semiconductor Switch

Figure 21:
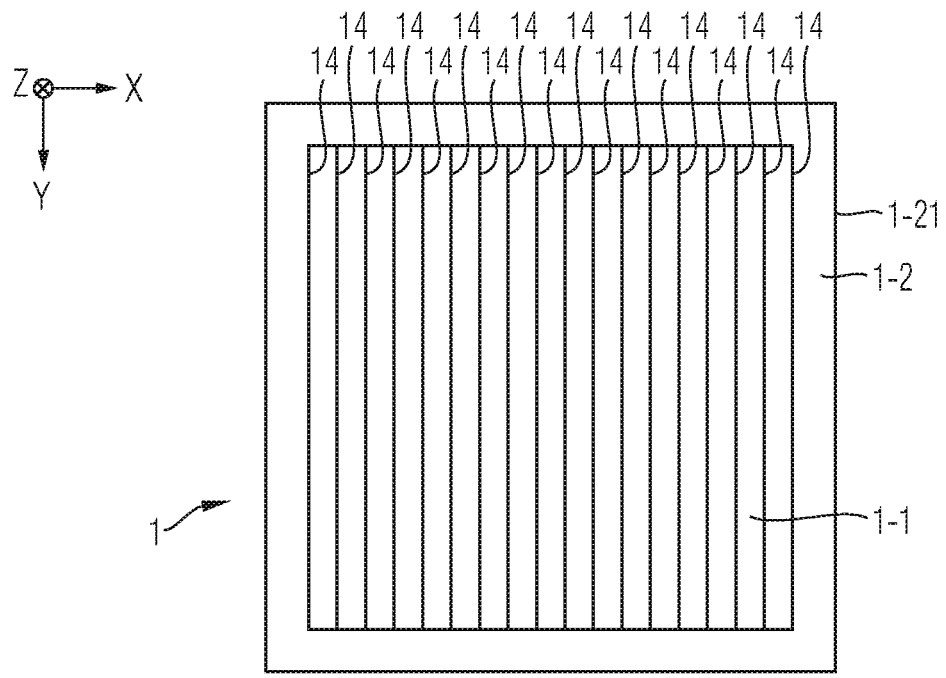
FIG. 21 schematically and exemplarily illustrates a section of a horizontal projection of a power semiconductor device in accordance with one or more embodiments.

The following description refers to examples of the above mentioned first exemplary subgroup of embodiments, wherein the power semiconductor device 1 is embodied as a power semiconductor switch, and to examples of corresponding methods:

FIG. 21 schematically and exemplarily illustrates a section of a horizontal projection of a power semiconductor switch 1 in accordance with one or more embodiments. Each of FIGS. 17A-18B schematically and exemplarily illustrates a section of a vertical cross-section of an embodiment of the power semiconductor switch 1 in accordance with one or more embodiments. In the following, it will be referred to each of FIGS. 21 and 17A-18B.

For example, the power semiconductor switch 1 comprises the semiconductor body 10 that is coupled to the first load terminal 11 (e.g., an emitter terminal 11) and the second terminal (e.g., a collector terminal 12).

Regarding all embodiments of FIGS. 17A-22 disclosed herein, the power semiconductor switch 1 may be a reverse blocking (RB) IGBT. For example, each of FIGS. 17A to 22 shows aspects of a power semiconductor switch that may be implemented so as to realize an RB IGBT.

The semiconductor body 10 may comprise the drift region 100 with dopants of the first conductivity type. For example, the extension of the drift region 100 along the extension direction Z and its dopant concentration are chosen in dependence of the blocking voltage rating for which the power semiconductor switch 1 shall be designed, e.g., in a manner as it is known to the skilled person.

Further, the emitter terminal 11 may be arranged on the frontside of the power semiconductor switch 1 and may include a frontside metallization. The collector terminal 12 may be arranged, opposite to the frontside, e.g., on a backside of the power semiconductor switch 1 and may include, for example, a backside metallization. Accordingly, the power semiconductor switch 1 may exhibit a vertical configuration, wherein the load current flows in a direction substantially in parallel to the vertical direction. In another embodiment, both of the emitter terminal 11 and the collector terminal 12 may be arranged on a common side, e.g., both on the frontside, of the power semiconductor switch 1.

The power semiconductor switch 1 may further include an active region 1-1, an inactive edge region 1-2 (herein also referred to as "termination structure" or as "inactive termination structure") and a chip edge 1-21 (cf. FIG. 21). The semiconductor body 10 may form a part of each of the active region 1-1 and the inactive edge region 1-2, wherein the chip edge 1-21 may laterally terminate the semiconductor body 10. The chip edge 1-21 may have become into being by means of wafer dicing, for example, and may extend along the vertical direction Z. The inactive edge region 1-2 may be arranged between the active region 1-1 and the chip edge 1-21, as illustrated in FIG. 21.

In the present specification, the terms "active region" and "inactive edge region"/"(inactive) termination structure" are employed in a common manner, i.e., the active region 1-1 and the inactive edge region 1-2 may be configured to provide for the principle technical functionalities typically associated therewith. For example, the active region 1-1 of the power semiconductor switch 1 is configured to conduct a load current between the terminals 11, 12, whereas the inactive edge region 1-2 does not conduct the load current, but rather fulfills functions regarding the course of the electric field, ensuring the blocking capability, safely terminating the active region 1-1 and so forth, in accordance with an embodiment. For example, the inactive edge region 1-2 may entirely surround the active region 1-1, as illustrated in FIG. 21.

In an embodiment, the each of the active region 1-1 and the inactive edge region 1-2 are configured to provide for a reverse blocking capability of the power semiconductor switch, as will be explained in more detail below.

The active region 1-1 may comprise at least one transistor cell 14 (cf. FIG. 21). In an embodiment, there are included a plurality of such transistor cells 14 within the active region 1-1. The number of transistor cells 14 may be greater than 100, than 1,000 or even greater than 10,000. The transistor cells 14 may each exhibit an identical configuration. Thus, in an embodiment, each transistor cell 14 may exhibit a configuration of a power unit cell, e.g., as illustrated in FIGS. 17A-19A. In the following, when an explanation is presented for an exemplary configuration of a specific transistor cell 14 (e.g., like "the transistor cell 14 comprises . . . " or "the component of the transistor cell 14 is/has . . . "), this explanation may equally apply to all transistor cells 14 that may be included in the power semiconductor switch 1, if not explicitly state otherwise.

Each transistor cell 14 may exhibit a stripe configuration as schematically illustrated in FIG. 21, wherein the total lateral extension in one lateral direction, e.g., along with the second lateral direction Y, of each transistor cell 14 and its components may substantially greater than the total lateral extension in the other lateral direction, e.g., along the first lateral direction X. For example, the longer total lateral extension in the second lateral direction Y of a respective stripe transistor cell 14 may approximately correspond to the total extension of the active region 1-1 along this lateral direction, as illustrated in FIG. 21.

In another embodiment, each transistor cell 14 may exhibit a cellular configuration, wherein the lateral extensions of each transistor cell 14 may be substantially smaller than the total lateral extensions of the active region 1-1.

Referring to all embodiments disclosed herein, each of the transistor cells 14 may exhibit a stripe configuration and can be configured to provide for an RB IGBT functionality.

Each transistor cell 14 may comprise a source region 101 with dopants of the first conductivity type and electrically connected to the emitter terminal 11. The dopant concentration present in the source region 101 may be significantly greater than the dopant concentration of the drift region 100.

Each transistor cell 14 may further comprise the first doped region 102 implemented as a semiconductor switch body region 102 (also referred to as "channel region"; however, herein, the term "channel region" is used in a different manner, see below) with dopants of a second conductivity type, wherein the first doped region 102 may separate the source region 101 from the drift region 100, e.g., the first doped region 102 may isolate the source region 101 from the drift region 100. Also the first doped region 102 may be electrically connected with the emitter terminal 11. A transition between the first doped region 102 and the drift region 100 may form a pn-junction 1021.

Figure 17A:
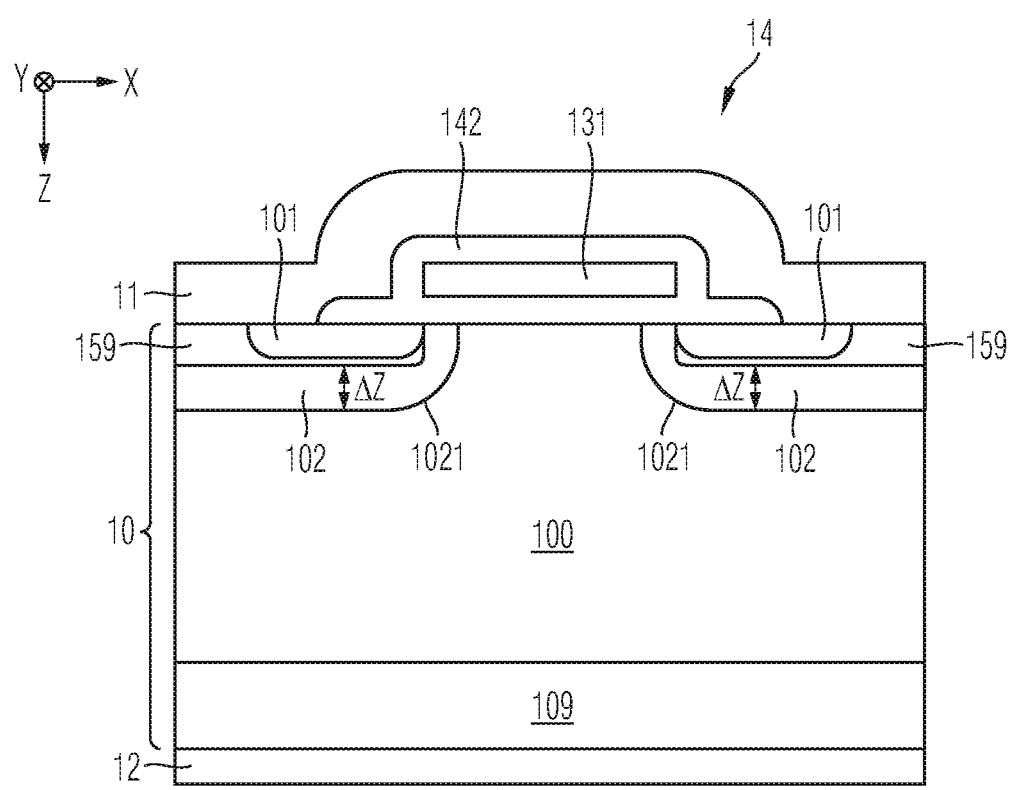
FIGS. 17A-17B each schematically and exemplarily illustrate a section of a vertical cross-section of a power semiconductor device in accordance with one or more embodiments.
Figure 17B:
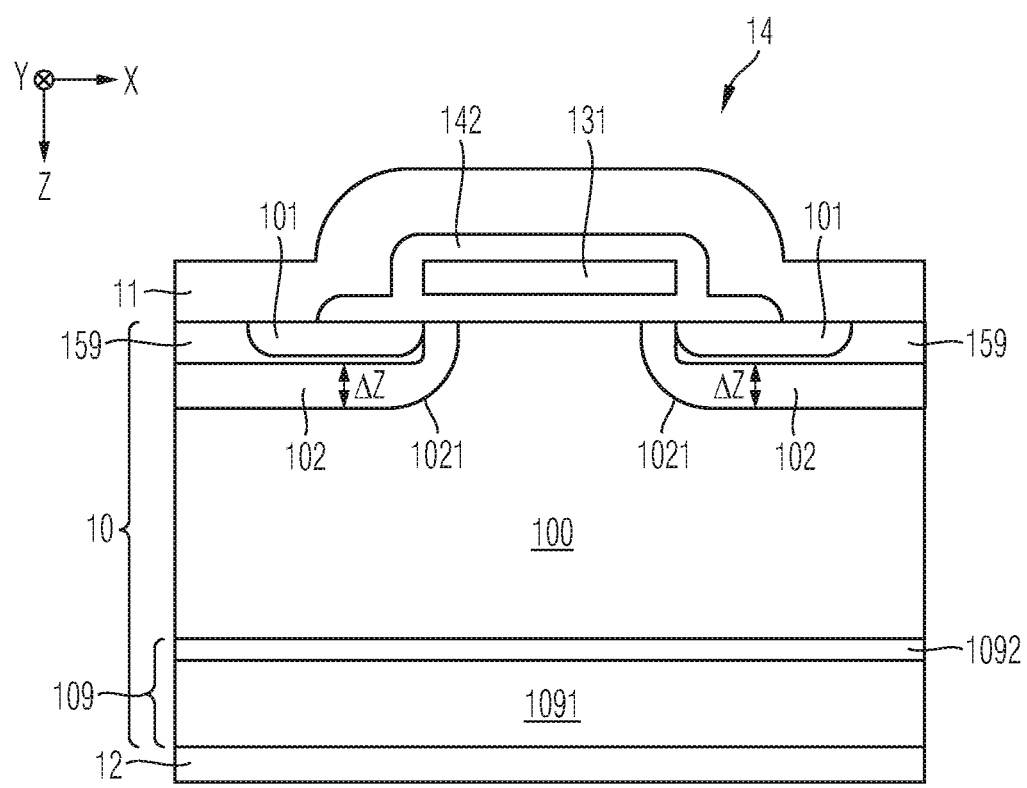

In accordance with the embodiments illustrated in FIGS. 17A and 17B, the drift region 100 may extend along the vertical direction Z until it interfaces with a doped contact region 109 that is arranged in electrical contact with the collector terminal 12. The doped contact region 109 may be formed in accordance with the configuration of the power semiconductor switch 1; e.g., the doped contact region 109 can include an emitter region 1091 with dopants of the second conductivity type, e.g. a p-type emitter region 1091.

In an embodiment, the emitter region 1091 does not comprise sections with dopants of the first conductivity type that are also electrically connected to the collector terminal 12. Thus, for example, embodiments described herein are not related to reverse conducting (RC) IGBTs. Rather, the semiconductor body 10 interfaces with the collector terminal 12 exclusively by means of the emitter region 1091, e.g., an entirely p-doped emitter region 1091, in accordance with an embodiment.

Figure 18A:
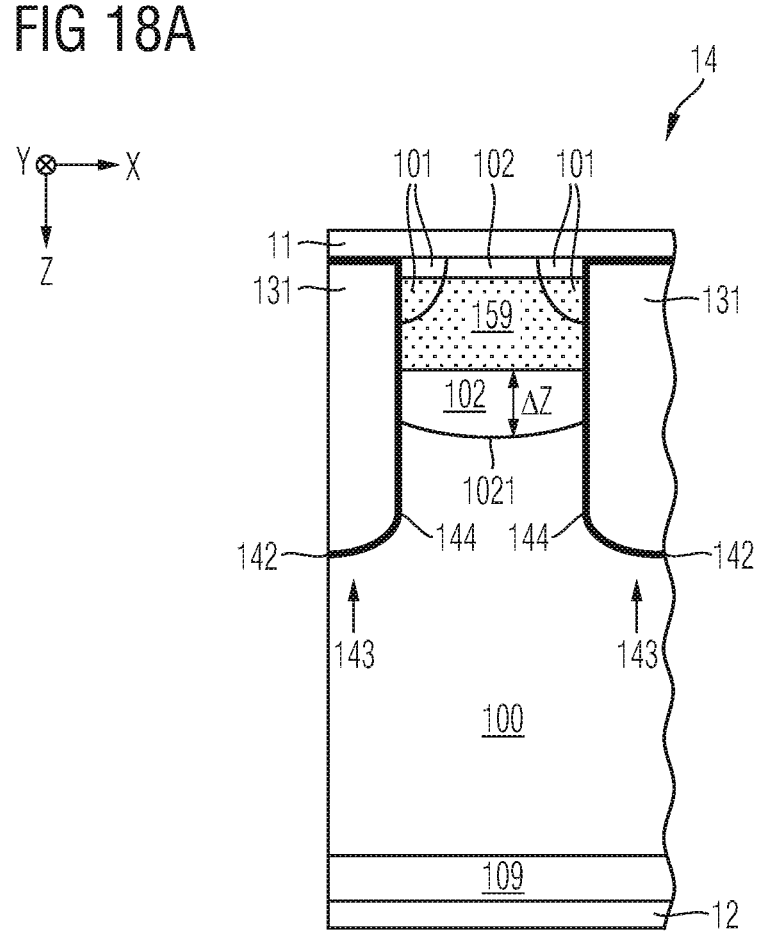
FIGS. 18A-18B each schematically and exemplarily illustrate a section of a vertical cross-section of a power semiconductor device in accordance with one or more embodiments.
Figure 18B:
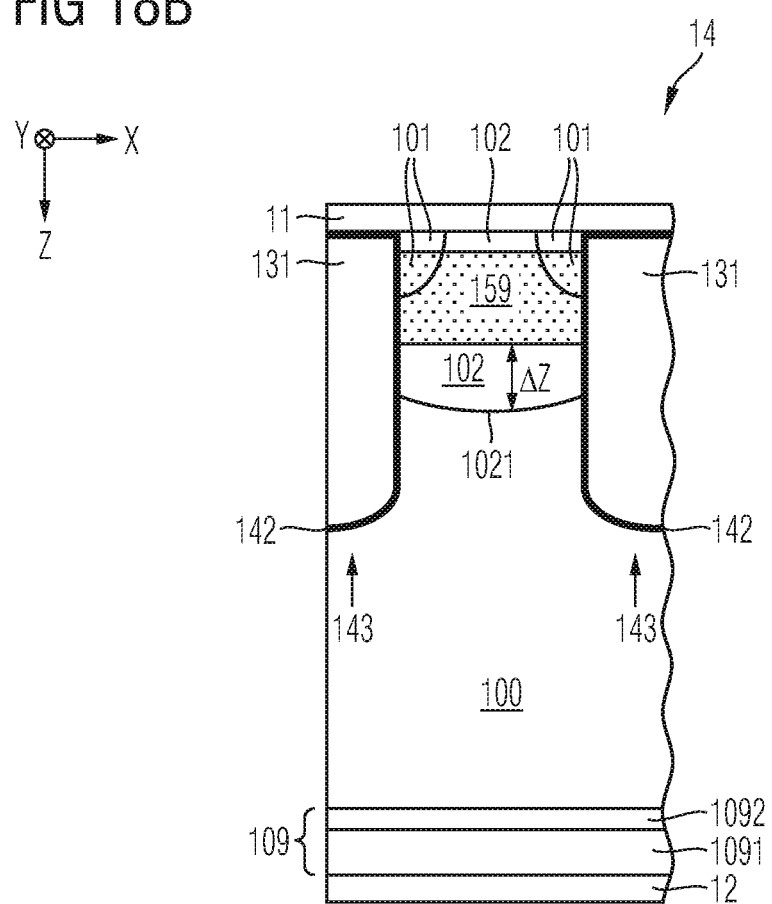

The doped contact region 109, may also include a field stop region 1092, as illustrated in each of FIGS. 17B and 18B. The field stop region 1092 may couple the drift region 100 to the emitter region 1091. For example, the field stop region 1092 may comprise dopants of the first conductivity type at a dopant concentration significantly greater than the dopant concentration of the drift region 100. Further, the field stop region 1092 may terminate the drift region 100.

In an embodiment, the field stop region 1092 exhibits a proton-irradiation induced dopant concentration of dopants of the first conductivity type that is greater than the drift region dopant concentration. Such proton-irradiation induced field stop can be realized by a proton irradiation with a subsequent annealing step at relatively low temperatures ranging between 370° C. and 430° C. over a time period ranging between 30 minutes and 5 hours. For example, this may allow for thin wafer processing, e.g., even for large wafer diameters, e.g. wafer diameters equal to or greater than 8".

Each transistor cell 14 may further comprise an insulated control terminal 131, e.g., a gate terminal, that may be implemented as a planar electrode (as illustrated in FIGS. 17A and 17B) or as a trench electrode (as illustrated in FIGS. 18A and 18B). For example, each transistor cell 14 may comprise at least one trench 143 that extends into the semiconductor body 10 and that houses the control terminal 131 implemented as a trench electrode and insulated from the semiconductor body 10 by means of an insulator 142. In case of a planar electrode, an insulation structure 142 may insulate the control terminal 131 from the semiconductor body 10.

In an embodiment, the drift region 100, the source region 101 and the first doped region 102 enable the power semiconductor switch 1 to be operated in: a conducting state during which a load current between the load terminals 11, 12 is conducted (within the semiconductor body 10) along a forward direction (e.g., against the vertical direction Z in terms of the technical current direction); in a forward blocking state during which a forward voltage applied between the terminals 11, 12 is blocked; and in a reverse blocking state during which a reverse voltage applied between the terminals 11, 12 is blocked.

For example, a forward voltage means that the electrical potential of the collector terminal 12 is greater than the electrical potential of the emitter terminal 11. For example, a reverse voltage means that the electrical potential of the collector terminal 12 is smaller than the electrical potential of the emitter terminal 11.

In an embodiment, the power semiconductor switch 1 is configured to not allow flow of a reverse load current in the semiconductor body 10, no matter which polarity the voltage applied between the load terminals 11, 12 exhibits. Thus, for example, there is only one conducting state, namely a forward conducting state, in which the load current in the forward direction (i.e., the forward load current) is conducted. However, when a reverse blocking voltage is present and being blocked, a small leakage current may nevertheless flow in the reverse direction (e.g., in parallel to the vertical direction Z in terms of a technical current direction).

For example, by means of providing a control signal to the control terminal 131, e.g., by generating a control voltage between the emitter terminal 11 and the control terminal 131, the power semiconductor switch 1 may be switched between the conducting state and the forward blocking state.

For example, the reverse blocking state during which a reverse voltage applied between the terminals 11, 12 is blocked can be achieved independently from the control voltage between the emitter terminal 11 and the control terminal 131.

For example (cf. FIG. 19A), during the conducting state, a channel region 103 (as indicated by the dashed rectangle) may be induced within a section of the first doped region 102. A conduction channel, e.g., an inversion channel that allows flow of the load current in the forward direction, may extend into the induced channel region 103. For example, the induced channel region 103, e.g., the induced inversion channel, may extend along a sidewall 144 of the trench 143 that houses the control electrode 131, as illustrated in FIG. 19A.

Further, during the forward blocking state, inducement of the channel region 103 may be inhibited. Rather, a space charge region is maintained so as to provide for the forward blocking capability.

In an embodiment, the power semiconductor switch 1, e.g., each transistor cell 14, comprises a recombination zone 159 arranged at least within the first doped region 102. The recombination zone 159 can be configured to reduce at least one of a lifetime and a mobility of charge carriers present within the recombination zone 159. For example, the recombination zone 159 is configured to provide for an increased charge carrier recombination rate within the recombination zone 159 as compared to a charge carrier recombination rate external of the recombination zone 159.

For example, the recombination zone 159 can contain crystal defects, e.g. double vacancies or vacancy-oxygen complexes, and/or atoms that act as recombination centers, e.g. platinum or gold atoms.

In an embodiment, the recombination zone 159 is laterally structured, e.g., along at least one of the first lateral direction X and the second lateral direction Y. For example, regarding each transistor cell 14, the recombination zone 159 does not extend entirely within a horizontal cross-section of the section of the semiconductor body 10 of respective transistor cell 14, but can be laterally structured within such horizontal cross-section of the respective transistor cell 14, e.g., only locally implemented within the transistor cell 14.

For example, in an embodiment, e.g., as exemplarily illustrated in each of FIG. 17A to FIG. 19A, the recombination zone 159 is structured such that it does not extend into the drift region 100. Such non-extension of the recombination zone 159 into the drift region 100 may be realized by ensuring that a crystal defect concentration within the drift region 100 is below a threshold level of one tenth of the crystal defect concentration in the recombination zone 159. In other words, the recombination zone 159 can be characterized in that it exhibits a crystal defect concentration at least ten times greater than a crystal defect concentration within the drift region 100. In another embodiment, the factor by which the crystal defect concentration in the drift region 100 is lower than within the recombination zone 159 is greater than ten, e.g., greater than 100 or even greater than 1000. For example, the recombination zone 159 can be characterized in that it exhibits a crystal defect concentration at least 1000 times greater than a crystal defect concentration within the drift region 100.

In a further embodiment, a the recombination zone 159 is laterally structured in that not each transistor cell 14 comprises a recombination zone 159, but, for example, only a certain share of the transistor cells 14. For example, only 50% or less of the transistor cells (e.g., every second transistor cell 14) comprise a respective recombination zone 159, or only 33.33% or less of the transistor cells (e.g., every third transistor cell 14) comprise a respective recombination zone 159, or only 25% or less of the transistor cells (e.g., every fourth transistor cell 14) comprise a respective recombination zone 159.

Further, a concentration of crystal defects that may be present within the recombination zone 159 may vary along at least one of the first lateral direction X and the second lateral direction Y or along a direction corresponding to a linear combination of the first and second lateral directions X and Y. In another embodiment, the concentration of crystal defects that may be present within the recombination zone 159 may be substantially constant along the lateral directions X and Y.

In an embodiment, the recombination zone 159 may also extend into the source region 101. This may allow for reducing the risk of an unwanted latch-up of the power semiconductor switch 1, as the electrons that may be emitted by the source region can recombine within the recombination zone 159, in accordance with an embodiment.

Further, the induced conduction channel, i.e., the channel region 103 into which the induced conduction channel may extend, and the recombination zone 159 can be spatially separated from each other; e.g., the induced channel region 103 and the recombination zone 159 do not spatially overlap with each other. This may avoid a negative influence on an on-state voltage drop of the switch 1, e.g., avoid an increase of the on-state voltage drop. For example, a minimum distance, e.g., the lateral distance ΔX indicated in FIG. 19A, between the recombination zone 159 and the induced channel region 103 (into which the conduction channel) amounts to at least 50 nm. The minimum distance can also be greater than 50 nm, e.g., greater than 100 nm or even greater than 200 nm. For example, the recombination zone 159 and the induced channel region 103 do not laterally overlap along the first lateral direction X. For example, in case of the of the control electrode 131 being implemented as a trench electrode, the recombination zone 159 and the control electrode 131 do not overlap along the first lateral direction X, and, in case of the of the control electrode 131 being implemented as a planar electrode, the recombination zone 159 and the control electrode 131 do not overlap along the vertical direction Z.

In accordance with an embodiment, the first doped region 102 extends deeper into the semiconductor body 10, e.g., along the vertical direction Z, than the recombination zone 159. For example, the distance along the vertical direction Z between the pn-junction 1021 and a deepest point of the recombination zone 159, e.g., the distance ΔZ indicated in each of FIGS. 17A-20A amounts to at least 0.5 μm, or to at least 5 μm. In an embodiment, the distance ΔZ is within the range of 1 μm to 3 μm. For example, by means of the distance ΔZ, it may be ensured that high electric field strengths do not occur within the recombination zone 159, e.g., during one or both of the blocking states of the power semiconductor switch 1.

Further, the recombination zone 159 may be arranged in contact with the emitter terminal 11 or be spaced apart therefrom along the vertical direction Z, e.g., by a distance within the range of 30 nm to 4000 nm or by a distance within the range of 50 nm to 2000 nm or by a distance within the range of 100 nm to 1000 nm.

In an embodiment, the total extension of the recombination zone 159 along the vertical direction Z may vary between the transistor cells 14. For example, a first share of the transistor cells 14 comprises a respective recombination zone 159 with a first total extension along the vertical direction Z, a second share of the transistor cells 14 comprises a respective recombination zone 159 with a second total extension along the vertical direction Z different from the first total extension, and a third share of the transistor cells 14 does not comprise a recombination zone 159.

In an embodiment, the emitter terminal 11 comprises a contact groove 111 that interfaces with each of the source region 101 and the first doped region 102, wherein the recombination zone 159 laterally overlaps with the contact groove 111 (cf. FIG. 19A) and exhibits lateral dimensions within the range of 60% to 200% or within the range of 80% to 120% of the lateral dimensions of the contact groove 111. For example, the recombination zone 159 exhibits a total lateral extension in the first lateral direction X amounting to substantially 100% of the total lateral extension in the first lateral direction X of the contact groove. In terms of processing (cf. method 200 illustrated in FIG. 22), the contact groove 111 may be formed within the insulation structure 142 and the recombination zone 159 may be created by means of carrying out an implantation processing step.

Said contact groove 111 may allow for carrying out the implantation processing step as a self-aligned processing step. For example, no separate mask needs to be provided for creating the recombination zone 159, in accordance with an embodiment. Later, the contact groove 111 may be filled with a conducting material to be connected to the emitter terminal 11, e.g., so as to electrically connect the source region 101 and the first doped region 102 with the emitter terminal 11. Additionally or alternatively, for further laterally structuring the recombination zone 159, a mask (not illustrated) may be employed, e.g., by depositing a resist material and by carrying out lithography processing steps, and by subsequently carrying out an implantation of, e.g., protons, helium, argon, silicon, oxygen, molybdenum, platinum, gold and/or boron so as to produce the recombination centers 159, e.g., only within a specific share of all transistor cells 14, e.g., only in every second, third, or forth transistor cell 14, as has been explained above.

In an embodiment, the active region 1-1 comprises a plurality of transistor cells 14 as described above, wherein each transistor cell 14 may be configured to be operated in said conducting state, said forward blocking state and said reverse blocking state. Further, the recombination zone 159 does not extend into the inactive edge region 1-2 that surrounds the active region 1-1.

Figure 19B:
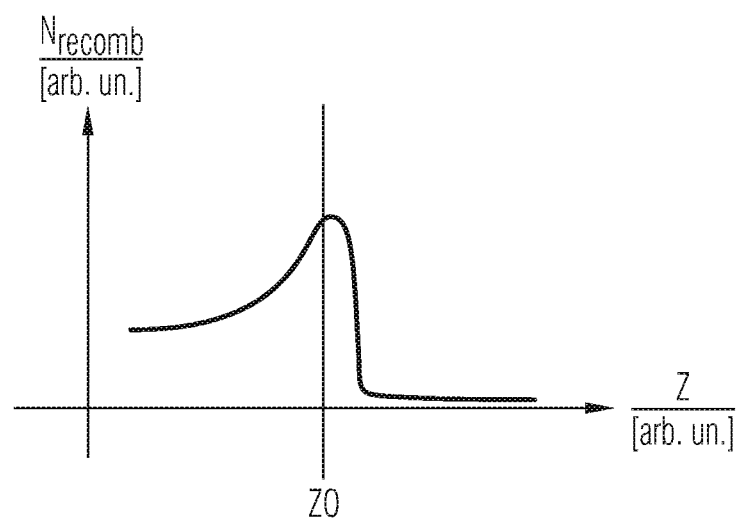
FIG. 19B schematically and exemplarily illustrates a course of a crystal defect concentration along a vertical direction within a first doped region (e.g., a body region) of a power semiconductor device in accordance with one or more embodiments.

Regarding now in more detail FIGS. 19A-B, the first doped region 102 may exhibit a first subsection 1023 and a second subsection 1022. The first subsection 1023 can interface with the emitter terminal 11 (i.e., the first load terminal) and can have a higher dopant concentration than the second subsection 1022. The second subsection 1022 can interface with the drift region 100 and, e.g., form said pn-junction 1021 with the drift region 100. For example, the first doped region 102 may consist of these two subsections 1022 and 1023, wherein the factor between the respective maximum dopant concentrations in these two subsections 1022 and 1023 may be greater than 2, 10 or even greater than 100, and wherein the second subsection 1022 may form the dominating part (in terms of space) of the first doped region 102, as illustrated in FIG. 19A. The first subsection 1023 may constitute a highly doped contact section of the first doped region 102.

For example, the recombination zone 159 extends into each of the first and second subsection 1023, 1022; i.e., also into the higher dopant first subsection 1023.

Regarding all embodiments described herein, the recombination zone 159 may exhibit crystal defects that may form a plurality of recombination centers within the recombination zone 159.

A crystal defect concentration of the recombination zone 159 may vary along at least the first lateral direction X and/or the second lateral direction Y by a factor of at least two. For example, the density of the recombination centers present in the first doped region 102 may be set to exhibit a specific profile in the horizontal directions.

Further, the crystal defect concentration of the recombination zone 159 may also or alternatively vary along the vertical direction Z by a factor of at least two. Said variations factors (lateral/vertical) may certainly be greater than two, e.g., greater than 5, than 10 or even greater than 100. A variation of the crystal defect concentration along the vertical direction Z is schematically and exemplarily illustrated in each of FIGS. 19B and 20B, wherein a crystal defect concentration may be proportional to a recombination rate $N_{recomb}$. Accordingly, the crystal defect concentration or, respectively, the recombination rate $N_{recomb}$, may initially increase along the vertical direction Z up to a peak and then decrease. For example, the decrease of the crystal defect concentration is not linear, as illustrated. For example, the reduction of the charge carrier lifetime is inhomogeneous along the vertical direction Z due to the crystal defect concentration of the recombination zone 159.

In an embodiment, the peak of the crystal defect concentration of the recombination zone 159 or, respectively, the peak of the recombination rate $N_{recomb}$, is located within an upper half of the second subsection 1022 or within a lower half of the first subsection 1023 of the first doped region 102. In an embodiment, regarding FIG. 20B, the peak of the crystal defect concentration of the recombination zone 159 is spaced apart along the vertical direction Z from a peak of the electric field E during the forward blocking state, e.g., by at least 100 nm or at least 1 μm. For example, it is ensured that the peak of the electric field does not extend into the recombination zone 159. To this end, e.g., said minimum distance ΔZ mentioned above can be kept between the pn-junction 1021 and the lowest point of the recombination zone 159.

Figure 20A:
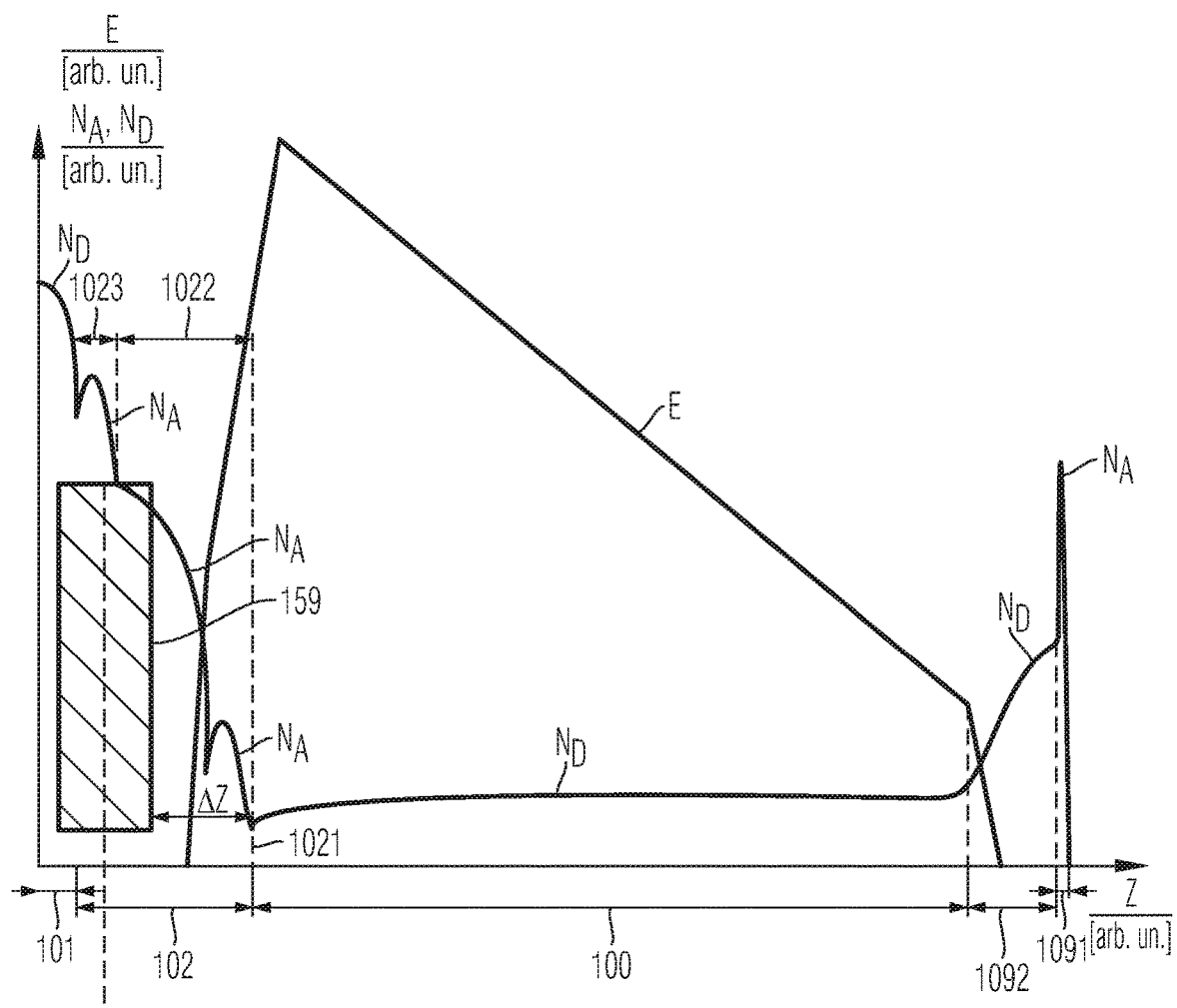
FIG. 20A schematically and exemplarily illustrates courses of dopant concentrations and a course of an electric field along a vertical direction within a semiconductor body of a power semiconductor device in accordance with one or more embodiments.
Figure 20B:
FIG. 20B schematically and exemplarily illustrates a course of a crystal defect concentration along a vertical direction within a first doped region (e.g. body region) of a power semiconductor device in accordance with one or more embodiments.

With regards to FIGS. 20A-B, exemplary courses of dopant concentrations $N_A$ (acceptor dopant concentration/p-type dopant concentration) and $N_D$ (donator dopant concentration/n-type dopant concentration) in conjunction with an exemplary course of the electric field E and an exemplary course of the crystal defect concentration of the recombination zone 159, each along the vertical direction Z, shall be described. For example, such courses can be found in an embodiment according to one or more of FIGS. 17A-19A.

As it is common for an IGBT, the dopant concentration present in the source region 101, e.g., an n-type dopant concentration, can be relatively high. The dopant concentration profile of the first doped region 102, e.g., a p-type dopant concentration, can be separated into three parts; an upper part with the highest dopant concentration, e.g., present in said first subsection 1023, e.g., for establishing a low ohmic contact to the emitter terminal 11, a middle part with a medium dopant concentration, e.g., included in said second subsection 1022, and a lower part, e.g., also included in said second subsection 1022, with a rather low mean concentration but optionally having one local maxima, e.g., such that the first doped region 102 provides for a field stop or a barrier, e.g., a p-barrier, functionality. Adjacent to the first doped region 102, the drift region 100 extends along the vertical direction and exhibits a rather low dopant concentration, e.g., an n-type dopant concentration. The field stop region 1092 exhibits a dopant concentration, e.g., of the n-type, significantly greater than the drift region 100. As has been explained above, the dopant concentration of the field stop region 1092 may be a proton-induced dopant concentration. Finally, the emitter region 1091, e.g., a p-type emitter, exhibits a relatively high dopant concentration.

The electric field E, during the forward blocking state, exhibits its peak close to the first doped region 102; however, in accordance with an embodiment, the peak does not extend into the recombination zone 159 that is implemented at least within the first doped region 102. Rather, the recombination zone 159 is spatially separated from the location of the peak of the electric field during the forward blocking state, in accordance with an embodiment.

As has been indicated above, the recombination zone 159 may comprise said crystal defects. The crystal defects may be formed by implanting ions into the first doped region 102. For example, the implanted ions include at least one of helium, argon, silicon, oxygen, molybdenum, platinum, gold and boron. In another embodiment, protons are implanted.

In an embodiment, the crystal defects are temperature-stable up to a temperature of at least 360°, of at least 390°, or of at least 420°. Further, the crystal defects may exhibit such temperature-stability at least for one hour, at least for two, or for even more than four hours. Such temperature and time ranges may occur, e.g., during processing of thin wafers. For example, in case of ions, it can thereby be ensured that the damage, e.g., the defects, caused by said ion implantation can be substantially maintained, even after a temperature annealing processing step.

Regarding finally the method 200 schematically and exemplarily illustrated in FIG. 22, it shall be understood that method 200 may be implemented in various embodiments, e.g., in embodiments corresponding to the exemplary embodiments of the power semiconductor switch 1 that have been explained with respect to the preceding drawings. In so far, it is referred to the above.

Generally, method 200 may comprise a first step 2000 in which a semiconductor body is provided that is to be coupled to a first load terminal and a second load terminal, and that comprises: a drift region with dopants of a first conductivity type; a source region with dopants of the first conductivity type and electrically connected to the first load terminal; and a first doped region with dopants of a second conductivity type and separating the source region from the drift region. The drift region, the source region and the first doped region enable the power semiconductor switch to be operated in: a conducting state during which a load current between the terminals is conducted along a forward direction; in a forward blocking state during which a forward voltage applied between the terminals is blocked; and in a reverse blocking state during which a reverse voltage applied between the terminals is blocked.

Method 200 may further comprise a step 2200 in which a recombination zone is provided within the first doped region.

For example, providing (in step 2200) the recombination zone may comprise introducing crystal defects into the semiconductor body by means of at least one of an implantation processing step and a diffusion processing step. For example, the implantation can be carried out with an implantation dose within the range of $10^{13}$ to $10^{14}$ atoms/cm$^2$. Subsequent to the implantation, a temperature annealing step may be carried out, wherein the crystal defects can be chosen such that these are temperature-stable up to a temperature of at least 360°, of at least 390°, or of at least 420°, as has been indicated above. Said temperature can thus be a maximum temperature of the temperature annealing step. Instead of implantation, also a controlled diffusion may be carried out in order to create the recombination zone. For example, a heavy metal, e.g., platinum, palladium, molybdenum, or the like can be diffused into the semiconductor body. For example, the diffusion is controlled and/or carried out by using a mask, which may allow for producing a concentration of crystal defects that varies in at least one of the lateral directions and the vertical direction, e.g., in a manner as illustrated in FIGS. 19B and 20B. In addition, method 200 can be carried out that the recombination zone 159 is not provided within the termination structure of the power semiconductor switch; for example, neither said implantation processing step nor said diffusion processing step is carried out in the termination structure.

Further, providing (in step 2200) the recombination zone may involve carrying out a self-aligned processing step using a groove where each of the source region and the first doped region are to be contacted by the first load terminal, as has been exemplarily explained with respect to FIG. 19B.

Embodiments of the power semiconductor switch described herein may constitute an RB IGBT and a corresponding processing method. The RB IGBT may comprise said recombination zone within the active region and implemented in the first doped region (e.g., the semiconductor switch body region), e.g., in proximity to a frontside of the RB IGBT. The recombination zone can be at least laterally structured. In addition, the crystal defect concentration may vary along at least one of the first lateral direction, the second lateral direction and the vertical direction. Such variation may allow for controlling the charge carrier lifetime reduction in proximity to the frontside of the RB IGBT, in accordance with one or more embodiments. For example, by means of the recombination zone, a frontside Partial-Transistor-Amplification-Factor (as known as Alpha$_{pnp}$) can be kept low and thus, at the same time, the reverse leakage current low remains low. In an embodiment, such RB IGBT may be employed within a multi-level power converter, e.g., in a power converter exhibiting a 3-Level configuration (e.g., NPC2 or T-type configuration) or in a matrix inverter.

Overvoltage Protection Power Semiconductor Chip

The following description refers to examples of the above mentioned second exemplary subgroup of embodiments, wherein the power semiconductor device 1 is embodied as an overvoltage protection power semiconductor chip or as an integrated power semiconductor module, and to examples of corresponding methods.

In accordance with the examples previously described with respect to FIGS. 17 to 22A, transistor cells 14 of a power semiconductor switch (e.g., a reverse blocking IGBT) that are configured to conduct the forward load current are equipped with the first doped region 102 (i.e., the body regions), wherein the first doped region 102 comprises the recombination zone 159. In such context, the proposed pnp-structure (102–>100/1092–>109) may allow for keeping both the frontside Partial-Transistor-Amplification-Factor (as known as Alpha$_{pnp}$) low and, at the same time, the reverse leakage current, as explained above.

In accordance with some of the following embodiments described with respect to FIGS. 1 to 16, the first doped region 102 and (the section of) the recombination zone 159 may be employed in another context, namely in semiconductor cells different from the cells that are used for carrying the load current, e.g. in designated breakthrough semiconductor cells that are in a conducting state only if a voltage applied at the load terminals 11, 12 exceeds an overvoltage threshold value. For example, the designated breakthrough semiconductor cells are integrated within a designated overvoltage protection power semiconductor chip that is separate from the power semiconductor device that is used for carrying the (nominal load current).

The present specification hence also relates to a power semiconductor based overvoltage protection chip for protecting a power semiconductor die against an overvoltage, e.g., against a transient overvoltage that may occur during a switching operation. The overvoltage protection chip described herein may also constitute a power semiconductor device, since it may be configured for temporarily carrying a load current, e.g., of at least 1 A up to 30 A, such as at least 2 A, such as at least 5 A, at least 10 A, or even more than 20 A, in order to reduce an overvoltage occurring at the power semiconductor device to be protected, and since it may exhibit the capability to block voltages.

FIG. 1 schematically and exemplarily illustrates a section of a horizontal projection of an overvoltage protection power semiconductor chip 1—in the following also simply referred to as "chip"—in accordance with one or more embodiments.

The chip 1 has a semiconductor body 10 that comprises each of an active region 1-1 and an inactive edge region 1-2 of the chip 1. The semiconductor body 10 may be coupled to each of a first load terminal and a second load terminal (not illustrated in FIG. 1; cf. reference numerals 11 and 12 in the other drawings, e.g., FIGS. 2A-B), wherein the first load terminal may be arranged at the frontside of the chip 1, and wherein the second load terminal may be arranged at the backside of the chip 1. The chip frontside and the chip backside may be arranged opposite of each other and, accordingly, the chip 1 may exhibit a vertical set up extending along the vertical direction Z.

The inactive edge region 1-2 may surround the active region 1-1, e.g., in a manner common for a power semiconductor device. The inactive edge region 1-2 may be terminated by an edge 1-21 that may have come into being by means of, e.g., wafer dicing.

The active region 1-1 may comprise a plurality of breakthrough cells 15, which may constitute a cell field of the active region 1-1. The breakthrough cells 15 may be arranged with a pitch P (cf. FIG. 24) within range of some micrometers, e.g., within the range of 10 to 30 μm, e.g., along the first lateral direction X.

For example, the inactive edge region 1-2 exhibits a greater breakdown voltage than each of the breakthrough cells 15. Thus, in accordance with an embodiment, the chip 1 may be configured to ensure that the breakdown, e.g., due to an overvoltage present at the load terminals, occurs within the active region 1-1, and not within the inactive edge region 1-2. This aspect will be elucidated in more detail below.

As illustrated, the breakthrough cells 15 may exhibit cellular configuration with, e.g., a circular circumference. In another embodiment, the cells 15 may exhibit a rectangular circumference, and ellipsoidal circumference or a cross-section with another geometric form.

For example, each of the breakthrough cells 15 exhibits a cellular configuration, and the breakthrough cells 15 are arranged within the active region 1-1 in accordance with a hexagonal tessellation pattern.

In yet another embodiment, the cells 15 may exhibit stripe cell configuration, having, e.g., a lateral extension corresponding approximately to the lateral extension of the active region 1-1.

Figure 3:
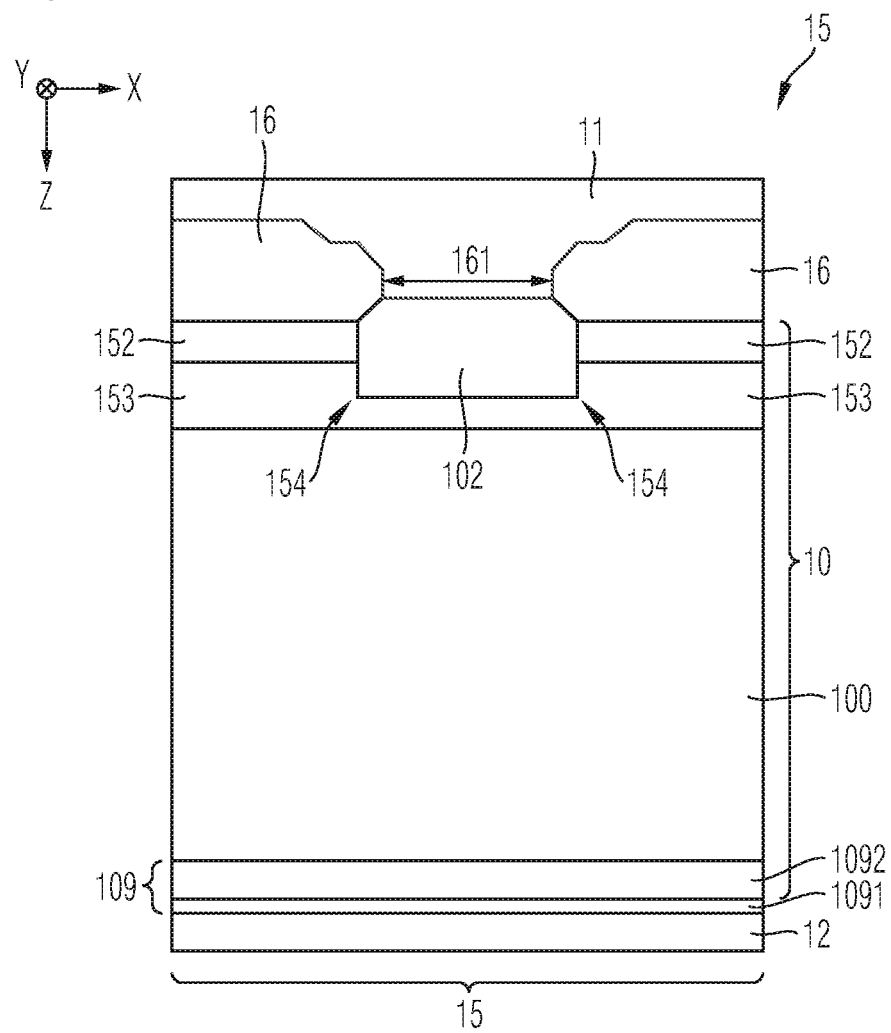
FIG. 3 schematically and exemplarily illustrates a section of a vertical cross-section of a power semiconductor device in accordance with one or more embodiments.

FIGS. 2A-B each schematically and exemplarily illustrate a section of a vertical cross-section of the overvoltage protection power semiconductor chip 1 in accordance with one or more embodiments. As mentioned above, the chip 1 may comprise said plurality of breakthrough cells 15 arranged in the active region 1-1. FIGS. 2A-B and 3, to which it will be referred in the following, illustrate exemplary configurations of such a breakthrough cell 15.

The breakthrough cell 15 may comprise an insulation structure 16 arranged at the chip frontside and having a recess 161 (corresponding to the insulation structure 142 (e.g. as shown in FIG. 19A) and the contact groove 111 mentioned above) into which the first load terminal 11 extends and interfaces with the semiconductor body 10. Already at this point, it is emphasized that the recess 161 must not necessarily have a depth as illustrated in FIGS. 2A-B. Rather, the insulation structure 16 may provide for an electrical insulation between the first load terminal 11 and a section of the semiconductor body 10 and, at the same time, allow the first load terminal 11 to interface, e.g., by means of said recess 161, with another section of the semiconductor body 10.

In an embodiment, the recess 161 may have a width along the first lateral direction within the range of up to 50% of the pitch P. E.g., the width of the recess 161 amounts to a value between 0.5 μm and 12 μm. A thickness (along the vertical direction Z) of the insulation structure 16 forming the recess 161 may be amount to at least several hundred nanometers.

The breakthrough cell 15 may further comprise the following regions, e.g., each implemented in the semiconductor body 10: a drift region 100 of the first conductivity type, e.g., n-type dopants; a first doped region 102 (e.g., an anode region 102) of the second conductivity type, e.g., p-type dopants, and being electrically connected to the first load terminal 11; a first barrier region 152 of the second conductivity type at a lower dopant concentration than the first doped region 102 and arranged in contact with each of the first doped region 102 and the insulation structure 16; and a second barrier region 153 of the first conductivity type at a higher dopant concentration than the drift region 100 and separating both the first doped region 102 and at least a part of the first barrier region 152 from the drift region 100; and a doped contact region 109 arranged in contact with the second load terminal 12, wherein the drift region 100 is positioned between the second barrier region 153 and the doped contact region 109.

In terms of functionality, each breakthrough cell 15 can be configured to remain in a non-conducting state (herein also referred to as forward blocking state) if the voltage between the load terminals 11, 12 is below a nominal chip blocking voltage, e.g., with the higher potential being present at the second load terminal 12. If the voltage between the load terminals 11, 12 increases above the nominal chip blocking voltage, however, the breakthrough cell 15 may adopt to a conducting breakthrough state, e.g., with the higher potential being present at the second load terminal 12. For example, during the non-conducting state, the breakthrough cell 15 does not conduct a load current between the first load terminal 11 and the second load terminal 12. Rather, the voltage applied between the load terminals 11 and 12 is blocked, e.g., with the higher potential being present at the second load terminal 12. Further, during the conducting breakthrough state, a load current can be conducted between the load terminals 11, 12, e.g., so as to reduce the voltage to a value equal to or below the nominal chip blocking voltage.

In an embodiment, each breakthrough cell 15 may further be configured to remain in a non-conducting reverse blocking state, e.g., when the first load terminal 11 exhibits a greater potential than the second load terminal 12.

Referring to all embodiments described herein, the nominal chip blocking voltage can be equal to or greater than 600 V, greater than 3000 V, or even greater than 8000 V.

Figure 6:
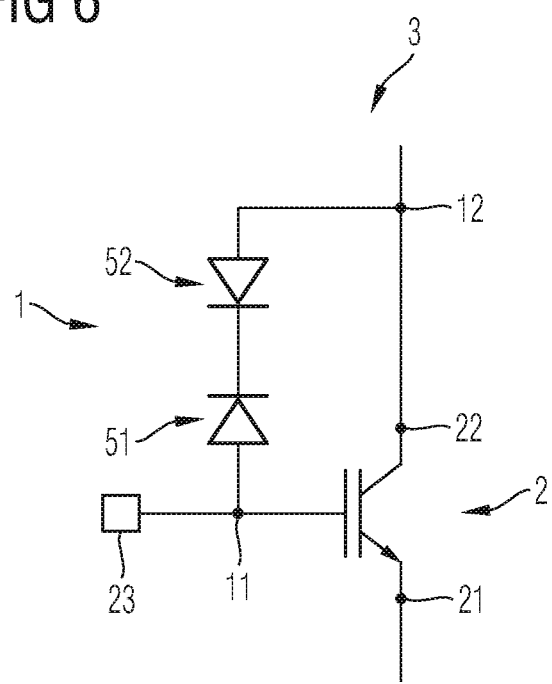
FIG. 6 schematically and exemplarily illustrates an equivalent circuit of a power semiconductor module comprising a power semiconductor transistor and a power semiconductor device in accordance with one or more embodiments.

For example, the chip 1 is coupled to a power semiconductor transistor, and each of the breakthrough cells 15 is configured for a nominal chip blocking voltage that has been determined in dependence of a nominal blocking voltage of the transistor 2 (cf. FIG. 6). Accordingly, the voltage applied between the load terminals 11, 12 may be substantially equal to an actual voltage applied to the power semiconductor transistor that is to be protected against an overvoltage, e.g., a transient overvoltage, by means of the chip 1. For example, the electrical potential applied to the second load terminal 12 may be equal to the electrical potential present at a collector (drain) terminal of the power semiconductor transistor, and the electrical potential applied to the first load terminal 11 may be equal to the electrical potential present at a gate terminal, e.g., a control terminal, of the power semiconductor transistor. This aspect will be elucidated in more detail below.

In the following, some exemplary structural features, e.g., dopant concentrations and spatial dimensions, of the some regions of the semiconductor body 10 shall be explained.

The drift region 100 may constitute the major part of the semiconductor body 10 and may exhibit a dopant concentration within the range of $5\mathrm{e}12\ \mathrm{cm}^{-3}$ to $2\mathrm{e}14\ \mathrm{cm}^{-3}$, or within in the range of $2\mathrm{e}13\ \mathrm{cm}^{-3}$ to $1\mathrm{e}14\ \mathrm{cm}^{-3}$, or within the range of $3\mathrm{e}13\ \mathrm{cm}^{-3}$ to $8\mathrm{e}13\ \mathrm{cm}^{-3}$. For example, the drift region 100 may extend for at least 40 μm, e.g., in the range between 40

µm to 650 µm or in the range from 60 µm to 350 µm or from 100 µm to 200 µm along the extension direction Z. The total extension of the drift region 100 as well as its dopant concentration may be chosen in dependence of the nominal chip blocking voltage for which the chip 1 shall be designed.

Referring additionally to FIG. 3, which schematically and exemplarily illustrates a section of a vertical cross-section of the overvoltage protection power semiconductor chip 1 in accordance with an embodiment, the doped contact region 109 arranged in contact with the second load terminal 12 may comprise an emitter region 1091, e.g., a backside emitter, and optionally a field stop region 1092. The emitter region 1091 may have dopants of the second conductivity type, e.g., with a maximum dopant concentration being in the range of $1e16$ $cm^{-3}$ to $1e20$ $cm^{-3}$, or in the range of $1e17$ $cm^{-3}$ to $1e19$ $cm^{-3}$. The field stop region 1092 can have dopants of the first conductivity type, e.g., with a maximum dopant concentration being greater than the dopant concentration of the drift region 100, e.g., in the range of $5e13$ $cm^{-3}$ to $1e16$ $cm^{-3}$, or in the range of $1e14$ $cm^{-3}$ to $2e15$ $cm^{-3}$. For example, the emitter region 1091 is electrically connected to the second load terminal 12, and the field stop region 1092 is arranged between the drift region 100 and the emitter 1091. The doped contact region 109 may exhibit a total extension along the extension direction Z that is significantly smaller as compared to the total extension of the drift region 100. In an embodiment, the doped contact region 109 may be configured in a similar manner as the backside structure of a semiconductor body of a transistor, e.g., of an IGBT.

In accordance with an embodiment, the transition between the second load terminal 12 and the doped contact region 109 may form a Schottky-contact. For example, this may allow to realize a reverse low voltage blocking capability/structure. To this end, it may further be appropriate that the doped contact region 109 exhibits an n-type dopant concentration at the interface to the second load terminal 12 that does not exceed the value of $1e19$ $cm^{-3}$.

Now regarding the frontside structure of the semiconductor body 10, in an embodiment, the electrical connection between the frontside of the semiconductor body 10 and the first load terminal 11 is established only by means of a transition between the first doped region 102 and the first load terminal 11. For example, none of the first barrier region 152, the second barrier region 153 and the drift region 100 is arranged in contact with the first load terminal 11.

Further, the second barrier region 153 may be arranged so as to separate both the entire first doped region 102 and the entire first barrier region 152 from the drift region 100.

In accordance with an embodiment, at least one of the first barrier regions 152 and the second barrier regions 153 of the breakthrough cells 15 forms a contiguous semiconductor layer. Thus, all breakthrough cells 15 of the active region 1-1 may be connected to each other by means of a contiguous semiconductor layer that constitutes the respective first barrier region 152 for each breakthrough cell 15. This optional aspect is exemplarily schematically illustrated in more detail in FIG. 24, which shows a vertical cross-section of an embodiment of the chip 1 shown in FIG. 1. Hence, both the first barrier region 152 and the second barrier region 153 may contiguously extend within the active region 1-1 so as to form a part of a plurality or of even all breakthrough cells 15 of the chip.

Each first barrier region 152 may be arranged so as to protect the insulation structure 16 against too high electrical field strengths.

Figure 24:
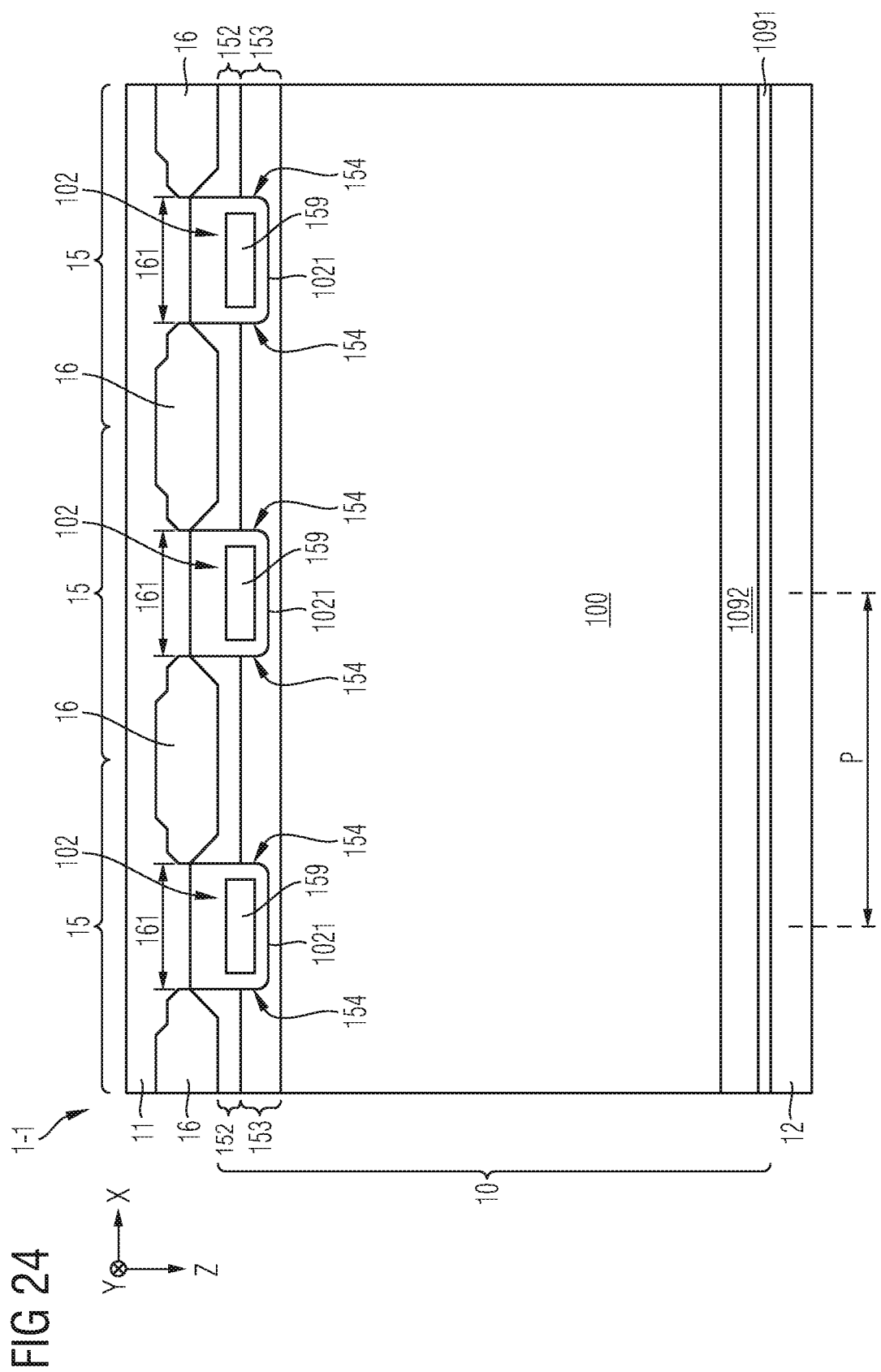
FIG. 24 schematically and exemplarily illustrates a section of a vertical cross-section of a power semiconductor device in accordance with one or more embodiments.

For example, as also indicated in FIG. 24, the first doped region 102 may extend deeper into the semiconductor body 10 than the first barrier region 152, wherein a step 154 formed due to the difference in depth level may be covered by the second semiconductor barrier region 153. In other words, step 154 may be formed at the transition between the first doped region 102 and the second barrier region 153. In addition, as has been mentioned above, the dopant concentration of the first doped region 102 can be greater as compared to the dopant concentration of the first barrier region 152.

For example, the step 154 defines the location of an initial breakdown when the voltage applied between the load terminals 11, 12 exceeds the chip nominal blocking voltage. This aspect will be elucidated in more detail with respect to FIG. 4 below.

For example, said step 154 may extend along the extension direction Z for at least 1 µm, for at least 3 µm, or for even more than 4 µm. It shall be understood that, depending on the process, step 154 may exhibit a course slightly different as illustrated. The step 154 is approximately at the corner formed between a bottom of the first doped region 102 and sidewalls of the first doped region 102. Said corner can be a rounded corner.

For example, the dopants for forming the first doped regions 102 may be provided by carrying out an implantation processing step, using the insulation structure 16 and the plurality of recesses 161 thereof as a mask, i.e., by means of a self-adjusted (self-aligned) process.

For example, the dopants present in each of the first doped region 102, the first barrier region 152 and the second barrier region 153 can be implanted dopants. This may allow for producing an accurate dopant concentration profile along with the extension direction Z.

Figure 4:
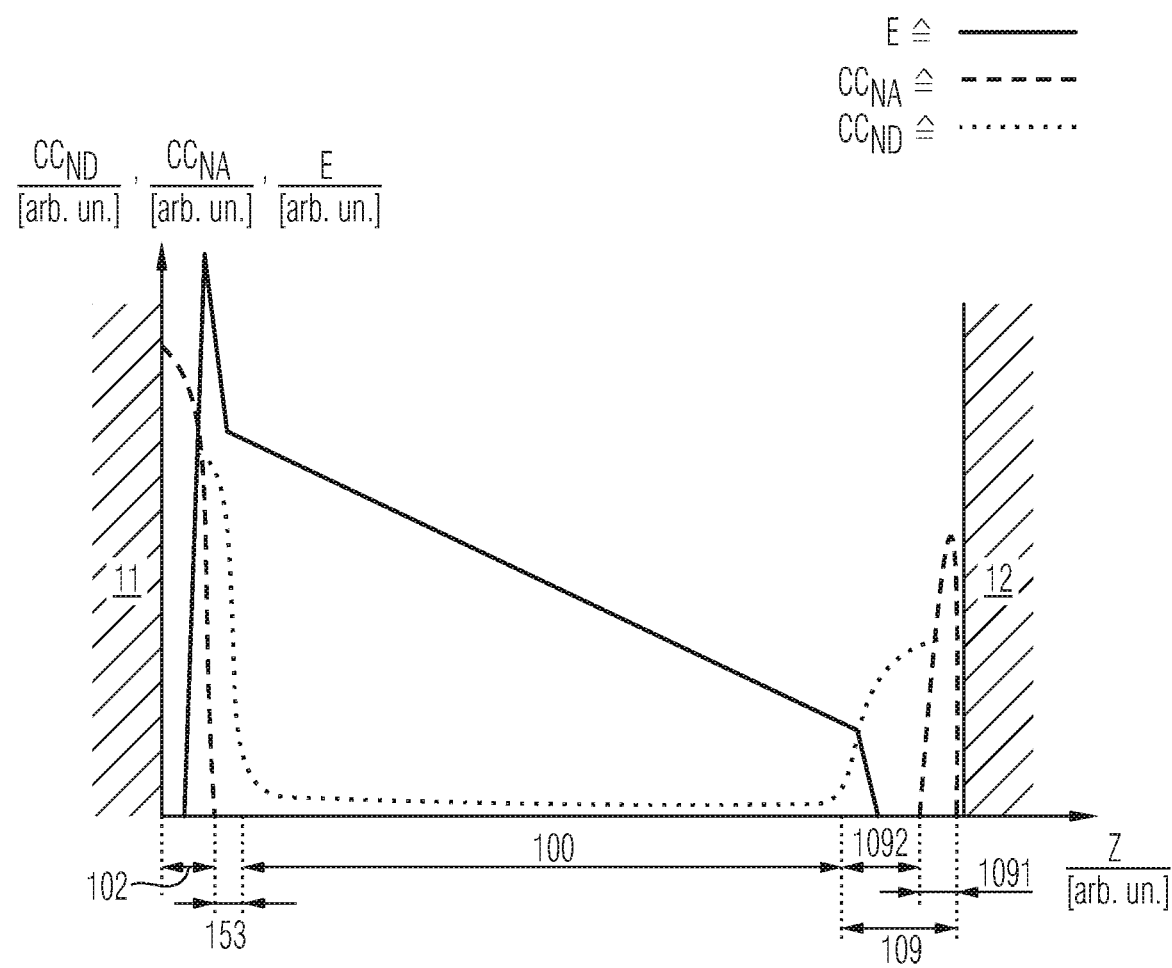
FIG. 4 schematically and exemplarily illustrates each of courses of dopant concentrations and a course of an electrical field in a power semiconductor device in accordance with one or more embodiments.

Now referring to FIG. 4, which schematically and exemplarily illustrates each of courses of dopant doses $CC_{ND}$, $CC_{NA}$ and a course of an electrical field E (each in an arbitrary unit (arb. an.)), in an embodiment of the overvoltage protection power semiconductor chip 1, e.g., in the embodiment as exemplarily illustrated in FIG. 3 and along an axis parallel to the extension direction Z that crosses the recess 161 in a central position, the following may apply:

The dopant dose ($CC_{NA}$) of the first doped region 102 may be within the range of $1e13$ $cm^{-2}$ to $5e14$ $cm^{-2}$, or within in the range of $5e14$ $cm^{-2}$ to $1e15$ $cm^{-2}$. In any case, the dopant dose of the first doped region 102 may be greater than the dopant concentration of the first barrier region 152, e.g., greater than a factor of at least 10, of at least 50, or of even more than 100. For example, the first doped region 102 may extend for at least 1 µm, e.g., in the range of 1 µm to 3 µm or in the range of 3 µm to 6 µm along the extension direction Z.

The dopant dose of the first barrier region 152 (not illustrated in FIG. 4) may be within the range of $1e11$ $cm^{-2}$ to $1e14$ $cm^{-2}$, or within in the range of $5e11$ $cm^{-2}$, to $1e13$ $cm^{-2}$, or within the range of $1e12$ $cm^{-2}$ to $8e12$ $cm^{-2}$. For example, the first barrier region 152 may extend for at least 1 µm along the extension direction Z.

The dopant dose ($CC_{ND}$) of the second barrier region 153 arranged adjacent to the first doped region 102 may be within the range of $1e12$ $cm^{-2}$ to $1e14$ $cm^{-2}$, or within in the range of $5e12$ $cm^{-2}$ to $5e13$ $cm^{-2}$, or within the range of $1e12$ $cm^{-2}$ to $1e13$ $cm^{-2}$. In any case, the dopant concentration of the second barrier region 153 may be greater than that dopant concentration of the drift region 100, e.g., greater than a factor of at least 1.5, of at least 4, or of even more than 6. For example, the second barrier region 153 may extend for at least 3 µm along the extension direction Z.

As already indicated above, if present, the emitter 1091 may have an integral dopant concentration ($CC_{NA}$) in the range of $1e12$ cm$^{-2}$ to $1e14$ cm$^{-2}$, and the field stop region 1092 may have a volumetric peak dopant concentration ($CC_{ND}$) in the range of $5e13$ cm$^{-3}$ to $1e16$ cm$^{-3}$, or in the range of $1e14$ cm$^{-3}$ to $2e15$ cm$^{-3}$.

For example, the second barrier region 153 may be configured to increase the rate of change of the electrical field in the non-conducting state of the breakthrough cell 15. As indicated in FIG. 4, during the non-conducting (i.e., blocking) state of the breakthrough cell 15, the electric field E may exhibit a maximum in a zone where the first doped region 102 interfaces with the second barrier region 153, e.g., at step 154. Accordingly, the initial breakdown during excess of the voltage applied between the load terminals 11 and 12 will be located in this zone, e.g., at step 154 formed at the transition between the first doped region 102 and the second barrier region 153, in accordance with an embodiment. Thus, in an embodiment, the proposed structure of the breakthrough cell 15 may allow for exactly positioning the location of the initial breakthrough in the chip 1.

Figure 5:
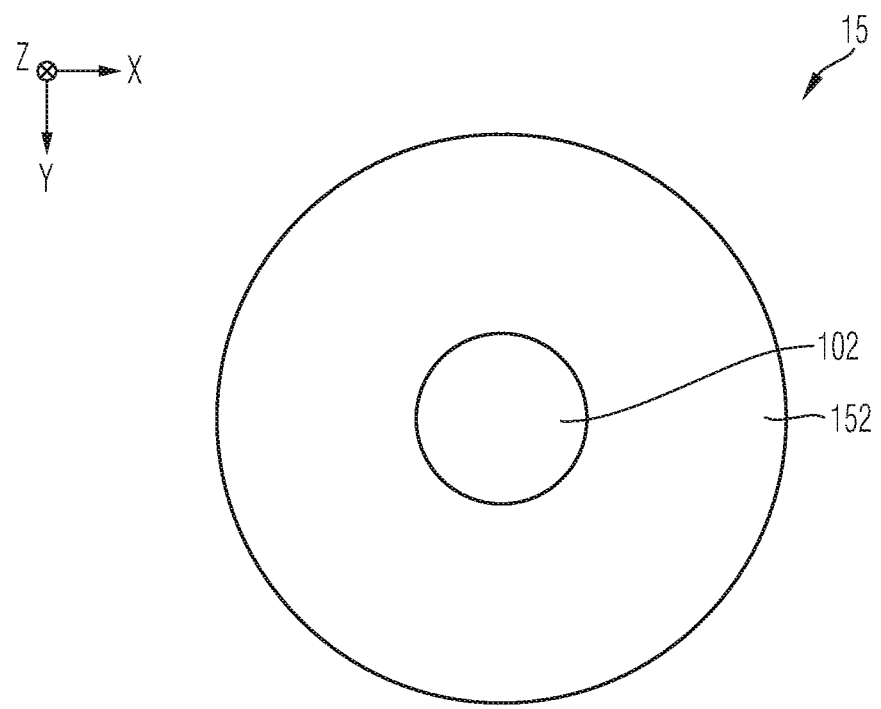
FIG. 5 schematically and exemplarily illustrates a section of a horizontal projection of a power semiconductor device in accordance with one or more embodiments.

Additionally referring to FIG. 5, which schematically and exemplarily illustrates a section of a horizontal projection, in accordance with an embodiment, in each of the breakthrough cells 15, the first doped region 102, the first barrier region 152 and the second barrier region 153 can be arranged symmetrically with respect to a fictitious vertical axis traversing the respective breakthrough cell 15. The fictitious vertical axis may be arranged in parallel to the extension direction Z. Accordingly, as has been mentioned above, each breakthrough cell 15 may exhibit a circular horizontal cross-section, for example. For example, such configuration may also contribute to exact positioning of the location of the breakthrough and it may further prevent movement of the breakthrough.

In accordance with an embodiment, for example as schematically exemplarily illustrated in both FIG. 2B and FIG. 24, the breakthrough cell 15 may further comprise the recombination zone 159 that extends into at least the first doped region 102.

For example, the recombination zone 159 provides a locally decreased charge carrier lifetime. For example, thereby, a recombination rate within the recombination zone 159, i.e., within the first doped region 102, may be increased.

Due to the recombination zone 159, the breakthrough cell 15 may provide for an inhomogeneous charge carrier lifetime along the extension direction Z, at least in proximity to the first load terminal 11. For example, due to the recombination zone 159, the charge carrier lifetime in the first doped region 102 varies along the extension direction Z by a factor of at least of 10 or even of at least 100.

In an embodiment, the recombination zone 159 may allow for reducing or even eliminating a temperature dependency of an eventual reverse current (which could also be referred to as a "reverse leakage current"), e.g., due to an amplification enhanced charge carrier generation. Such reverse current may come into being if the potential of the first load terminal 11 is greater than the potential of the second load terminal 12, e.g., during the reverse blocking state of the breakthrough cell 15.

In addition, the recombination zone 159, i.e., its extension along the extension direction Z and the charge carrier lifetime present therein, can be chosen so as to adjust an amplification factor (a) of the doped contact region 109, which may include, as has been explained above, the emitter region 1091.

In accordance with an embodiment (not illustrated), the recombination zone 159 may also extend into the section of the second barrier region 153 arranged below the first doped region 102, and optionally even slightly into the drift region 100.

For example, the recombination zone 159 may be produced by carrying out a damage implantation processing step, e.g., using the insulation structure 16 and its recess 161 as a mask. Accordingly, in an embodiment, the recombination zone 159 can be produced using a self-adjusted (self-aligned) process, during which, for example, no separate mask is needed in order to correctly position the recombination zone 159. By means of carrying out the implantation processing step with a defined implantation energy and a defined implantation dose and duration, the total extension of the recombination zone 159 along the extension direction Z and the charge carrier lifetime present therein can be exactly adjusted.

In an embodiment, at least one of argon (Ar), silicon (Si), oxygen (O), helium (He), molybdenum (Mo) and boron (B) is used as an implantation material for forming the recombination zone 159. In another embodiment, protons are implanted for forming the recombination zone 159.

The implantation processing step may occur with an implantation dose within the range of $5e13$ atoms/cm$^2$ to $1e15$ atoms/cm$^2$, and/or an implantation energy within the range of 150 keV to 1.5 MeV, for example.

After the implantation processing step, a high temperature annealing processing step may occur, e.g., at temperatures below 450° C., e.g., so as to maintain the damage caused by the implantation.

In another embodiment, the recombination zone 159 is produced by carrying out a diffusion processing step. For example, a heavy metal, such as platinum (Pt), palladium (Pd) and/or molybdenum (Mo), can be used in order to produce an inhomogeneous charge carrier lifetime profile along the extension direction Z.

In an embodiment, the charge carrier lifetime does not only vary along the extension direction Z, but, additionally or alternatively, also along at least one of the lateral directions X and Y.

In an embodiment, the concentration of the material used for forming the recombination zone 159, e.g., a damage material, may exhibit its maximum at a median position of the recombination zone 159 along the extension direction Z. Further, the charge carrier lifetime may be inversely proportional to said concentration. Thus, for example, at the median position of the recombination zone 159 along the extension direction Z (wherein said position may be arranged within the first doped region 102), the charge carrier lifetime may exhibit a minimum.

Further, the concentration of the material used for forming the recombination zone 159 may decrease along the lateral directions X and Y and along any linear combination of thereof), e.g., in an exponential manner.

Figure 25A:
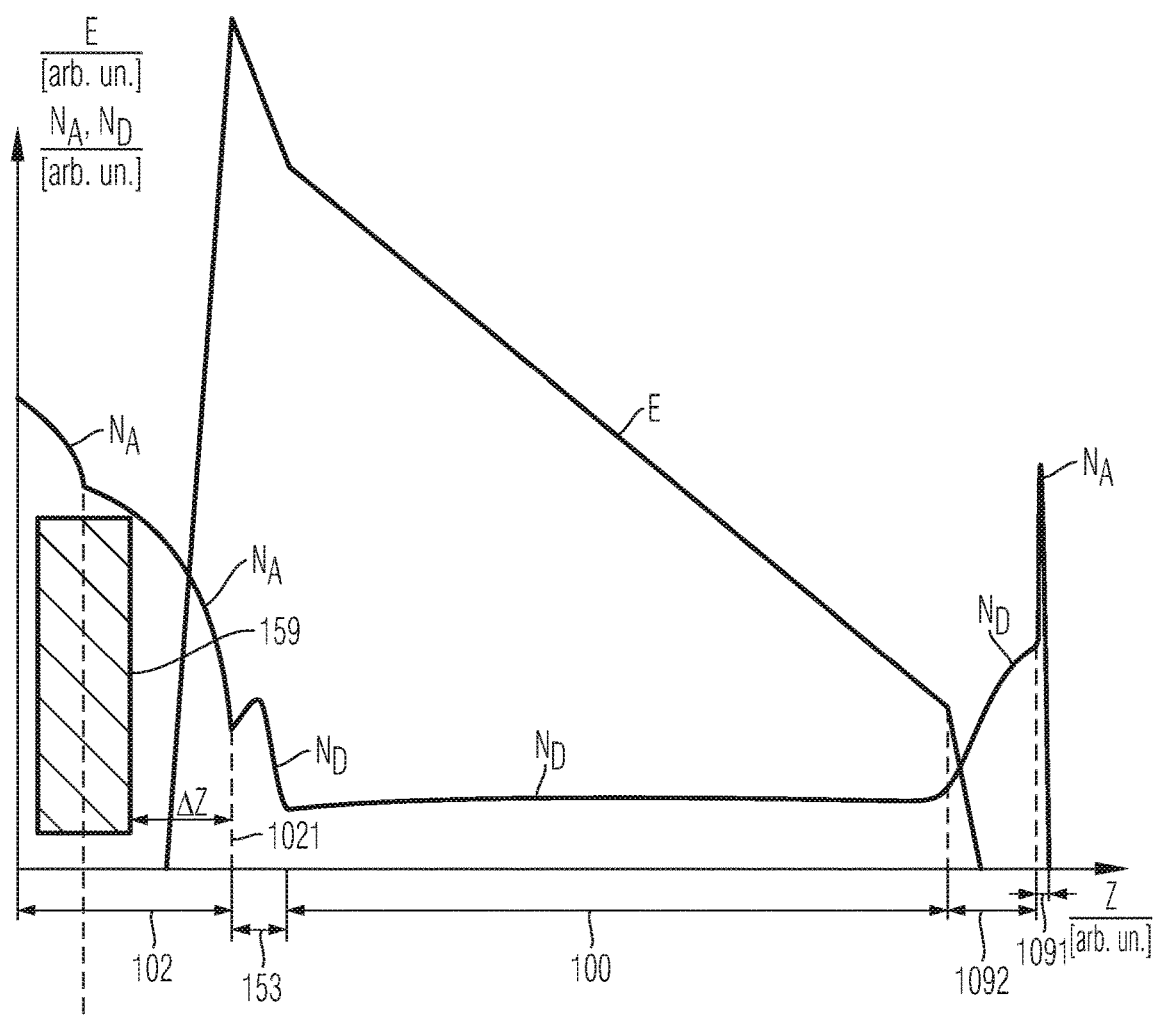
FIG. 25A schematically and exemplarily illustrates courses of dopant concentrations and a course of an electric field along a vertical direction within a semiconductor body of a power semiconductor device in accordance with one or more embodiments.
Figure 25B:
FIG. 25B schematically and exemplarily illustrates a course of a crystal defect concentration along a vertical direction within a first doped region (e.g. body region) of a power semiconductor device in accordance with one or more embodiments.

With regards to FIGS. 25A-B, exemplary courses of dopant concentrations $N_A$ (acceptor dopant concentration/p-type dopant concentration) and $N_D$ (donator dopant concentration/n-type dopant concentration) in conjunction with an exemplary course of the electric field E and an exemplary course of the crystal defect concentration of the recombination zone 159, each along the vertical direction Z, shall be described. For example, such courses can be found in an embodiment according to one or more of FIGS. 1-16, wherein FIG. 25A addresses the second barrier region 153 (the first barrier region 152 may or may not be present; e.g., referring to FIG. 3, a cross-section along the vertical direction Z through the recess 161 does not cross the first barrier region 152).

The dopant concentration profile of the first doped region 102, e.g., a p-type dopant concentration, can be separated into two or more parts; e.g., an upper part with the highest dopant concentration, e.g., for establishing a low ohmic contact to the emitter terminal 11, a middle part with a medium dopant concentration, and, optionally, a lower part, with a rather low mean concentration but optionally having one local maxima (not illustrated in FIG. 25A), e.g., such that the first doped region 102 provides for a field stop or a barrier, e.g., a p-barrier, functionality. Adjacent or coupled to the first doped region 102, the drift region 100 extends along the vertical direction and exhibits a rather low dopant concentration, e.g., an n-type dopant concentration. As explained above, the second barrier region 153 may be implemented between the first doped zone 102 and the drift region 100, wherein the second barrier region 153 forms the pn-junction 1021 with the first doped zone 102 and exhibits a significantly higher dopant concentration than the drift region 100. The field stop region 1092 exhibits a dopant concentration, e.g., of the n-type, significantly greater than the drift region 100. As has been explained above, the dopant concentration of the field stop region 1092 may be a proton-induced dopant concentration. Finally, the emitter region 1091, e.g., a p-type emitter, exhibits a relatively high dopant concentration.

The electric field E, during the forward blocking state, exhibits its peak close to the first doped region 102; however, in accordance with an embodiment, the peak does not extend into the recombination zone 159 that is implemented at least within the first doped region 102. Rather, the recombination zone 159 is spatially separated from the location of the peak of the electric field during the forward blocking state (cf. distance $\Delta Z$), in accordance with an embodiment. For example, the distance along the vertical direction Z between the pn-junction 1021 and a deepest point of the recombination zone 159, e.g., the distance $\Delta Z$ indicated in each of FIG. 25A amounts to at least 0.5 µm, or to at least 5 µm. In an embodiment, the distance $\Delta Z$ is within the range of 1 µm to 3 µm.

As has been indicated above, the recombination zone 159 may comprise said crystal defects. The crystal defects may be formed by implanting ions into the first doped region 102. For example, the implanted ions include at least one of helium, argon, silicon, oxygen, molybdenum, platinum, gold and boron. In another embodiment, protons are implanted.

In an embodiment, the crystal defects are temperature-stable up to a temperature of at least 360°, of at least 390°, or of at least 420°. Further, the crystal defects may exhibit such temperature-stability at least for one hour, at least for two, or for even more than four hours. Such temperature and time ranges may occur, e.g., during processing of thin wafers. For example, in case of ions, it can thereby be ensured that the damage, e.g., the defects, caused by said ion implantation can be substantially maintained, even after a temperature annealing processing step.

Regarding further aspects of the recombination zone 159 as shown in FIG. 25A, e.g., its position, its recombination centers etc., it is referred to the description of the switch 1 above, e.g., to the description of FIGS. 20A-B.

FIG. 6 schematically and exemplarily illustrates an equivalent circuit of a power semiconductor module 3 comprising a power semiconductor transistor 2 and an embodiment of the overvoltage protection power semiconductor chip 1. The overvoltage protection power semiconductor chip 1 may exhibit one of the configurations that have been explained in the above with respect to the preceding drawings.

Accordingly, in an equivalent circuit, the chip 1 may be depicted as two diodes connected anti-serially with each other (cf. also FIG. 23), wherein the two cathode regions of the diodes can be formed by the drift region 100. For example, the power semiconductor transistor 2 to be protected against an overvoltage may exhibit an IGBT configuration. For example, the transistor 2 has an emitter terminal (also referred to as source terminal) 21, a collector terminal (also referred to as drain terminal) 22 and a gate terminal 23, which may form, e.g., a control terminal.

As illustrated in FIG. 6, the collector terminal 22 can be electrically connected to the second load terminal 12 of the chip 1, and the first load terminal 11 of the chip 1 may be electrically connected to the control terminal 23 of the transistor 2. Thus, both the first load terminal 11 and the gate terminal 23 may "see" the same control signal. In another embodiment, the first load terminal 11 of the chip 1 is connected to another terminal exhibiting another electrical potential as the gate terminal 23, which may allow for controlling the chip 1 independently from the transistor 2. For example, the transistor 2 may be controlled in a usual manner, e.g., by applying a control voltage between the gate terminal 23 and the emitter terminal 21, e.g., so as to selectively set the transistor 2 in one of a conducting state and blocking state, e.g., so as to control switching operation of the transistor 2.

Figure 7:
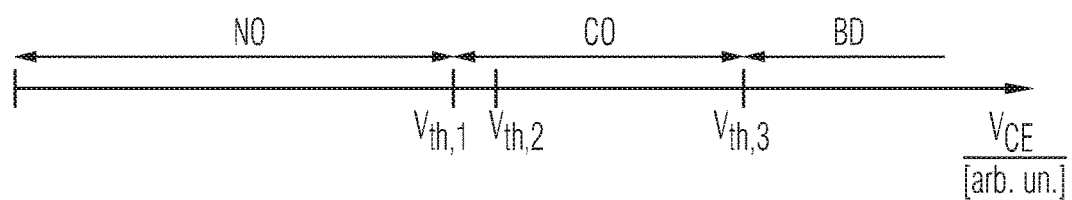
FIG. 7 schematically and exemplarily illustrates operating ranges of a power semiconductor module comprising a power semiconductor transistor and a power semiconductor device in accordance with one or more embodiments.

FIG. 7 schematically and exemplarily illustrates operating ranges of the power semiconductor module 3 depicted in FIG. 6. For example, if the voltage $V_{CE}$ between the collector terminal 22 and the emitter terminal 21 is below the first threshold value $V_{th,1}$, the transistor 2 may be operated normally, e.g., with no breakdown situation occurring. If the voltage $V_{CE}$ exceeds a third threshold value $V_{th,3}$, the transistor 2 may breakdown, e.g., voltages $V_{CE}$ above $V_{th,3}$ may constitute voltages significantly above the voltage rating of the transistor 2, which is indicated by the second threshold value $V_{th,2}$ in FIG. 7. If the voltage $V_{CE}$ is within the range defined by the first threshold value $V_{th,1}$ and the third threshold value $V_{th,3}$, a clamping operation may be implemented, e.g., an active clamping operation or conditional active clamping operation. In an embodiment, the chip 1 is configured to be employed during such clamping operation.

For example, the first threshold value $V_{th,1}$ indicates the nominal chip blocking voltage of the chip 1. Accordingly, as has been explained above, if the voltage between the load terminals 12 and 11 exceeds the value $V_{th,1}$, the breakthrough cells 15 of the chip 1 may adopt to a conducting breakthrough state. The second threshold value $V_{th,2}$ may indicate the blocking voltage for which the transistor 2 has been rated. For example, $V_{th,1}$ amounts to approximately 1500 V, and $V_{th,2}$ amounts to approximately 1600 V. The third threshold value $V_{th,3}$ may indicate the voltage at which the transistor 2 breaks down. For example the third value $V_{th,3}$ may amount to approximately 1900 V.

For example, during switching operations of transistor 2 within voltage ranges of $V_{CE}$ below $V_{th,1}$, the chip 1 remains entirely inactive, i.e., each breakthrough cells 15 remains in the non-conducting state. During switching operations in which $V_{CE}$ exceeds $V_{th,1}$, chip 1 may be configured to reduce this voltage $V_{CE}$ due to the breakthrough cells 15 adopting the conducting breakthrough state.

Thus, in an example, if an overvoltage occurs at the collector terminal 22, the breakthrough cells 15 of the chip 1 may adopt to the conducting breakthrough state, which may lead to re-turn-on operation at the transistor 2. Such re-turn-on operation reduces the voltage $V_{CE}$ between the collector terminal 22 and the emitter terminal 21 to safe values, e.g. between $V_{th,1}$ and $V_{th,3}$ in accordance with an embodiment. If the transistor 2 is operated in the on-state, i.e., when conducting a load current, the breakthrough cells 15 of the chip 1 remain inactive, e.g., by maintaining said reverse blocking state.

Figure 8:
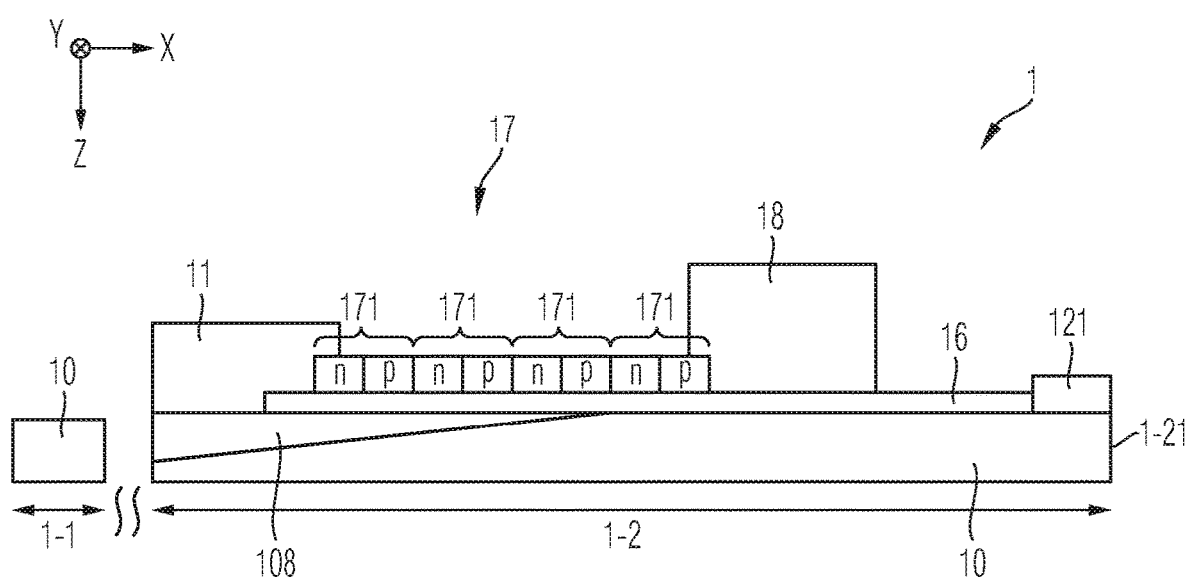
FIG. 8 schematically and exemplarily illustrates a section of a vertical cross-section of an inactive edge region of a power semiconductor device in accordance with one or more embodiments.

In the following, further exemplary optional aspects will be explained:

FIG. 8 schematically and exemplarily illustrates a section of a vertical cross-section of the inactive edge 1-2 region of an embodiment of the overvoltage protection power semiconductor chip 1. The chip 1 may comprise a diode arrangement 17 arranged at the frontside and external of the semiconductor body 10, wherein the diode arrangement 17 laterally overlaps with the inactive edge region 1-2 and is connected to the first load terminal 11 and to a further terminal 18. The diode structure 17 may be configured to block a voltage in both directions, e.g., up to a magnitude of at least 20 V.

For example, the further terminal 18 is electrically connected to the emitter terminal 21 of the power semiconductor transistor 2. Then, the diode structure 17 may be configured to protect the gate terminal 23 against too high voltages, e.g., against voltages above the blocking capability of the diode structure 17 of, e.g., 20 V. With respect to the equivalent circuit schematically illustrated in FIG. 6, the diode structure 17 can be arranged between terminals 11 and 21. Accordingly, by means of the diode structure 17, the chip 1 may provide the transistor 2 with extended protection; the transistor is not only protected against too high values of $V_{CE}$, but also against too high values of $V_{GE}$ (voltage between terminals 21 and 11 in FIG. 6), in accordance with an embodiment.

The inactive edge region 1-2 may be terminated by a channel stopper ring 121 that may be electrically connected to the second load terminal 12. The diode structure may comprise one or more diodes 171 connected in series with each other. For example, the diodes 171 may be polycrystalline diodes. Further, the first load terminal 11 may be electrically connected to a cathode port of the diode structure 17, and the further terminal 18 may be electrically connected to an anode port of the diode structure 17.

Further, the semiconductor body 10 may include a doped semiconductor structure 108 laterally overlapping with each of the first load terminal 11 and the diode structure 17. For example, the doped semiconductor structure 108 exhibits the VLD (variation of lateral doping) configuration.

Figure 9:
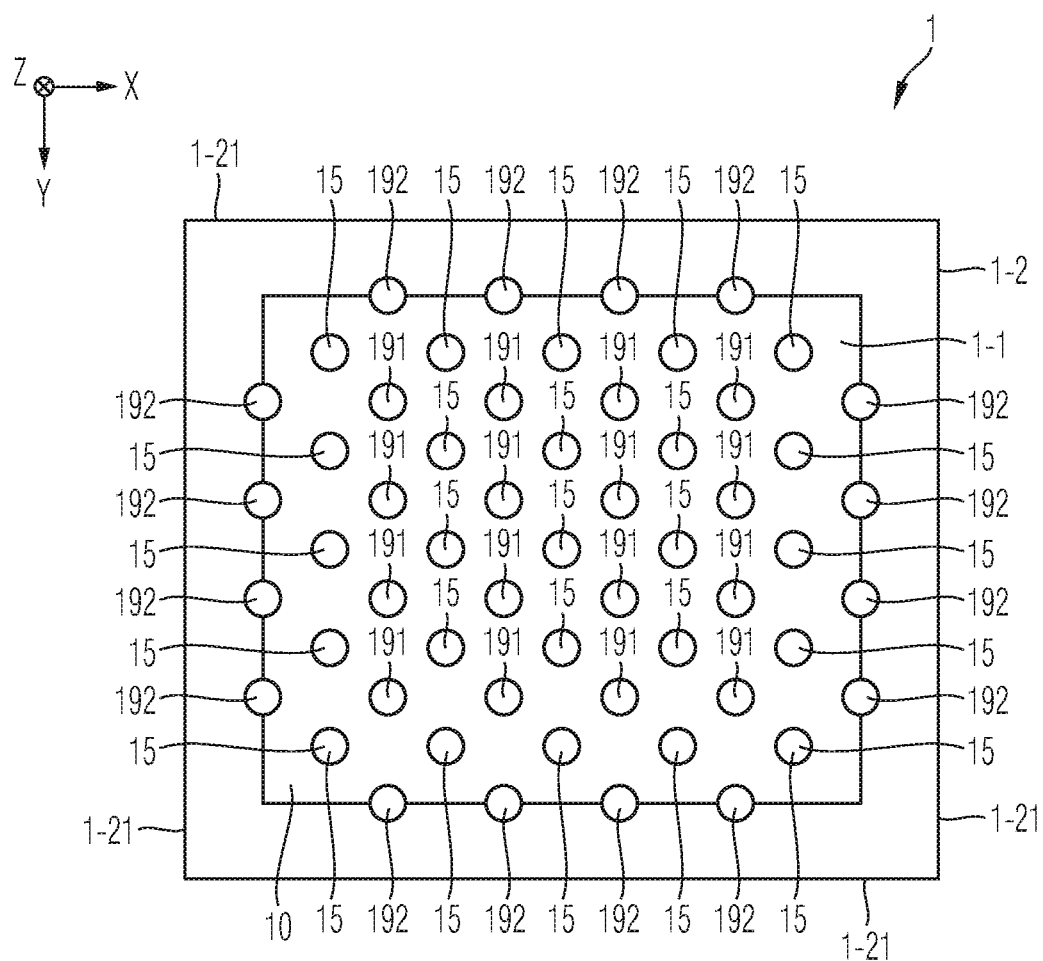
FIG. 9 schematically and exemplarily illustrates a section of a horizontal projection of a power semiconductor device in accordance with one or more embodiments.
Figure 10:
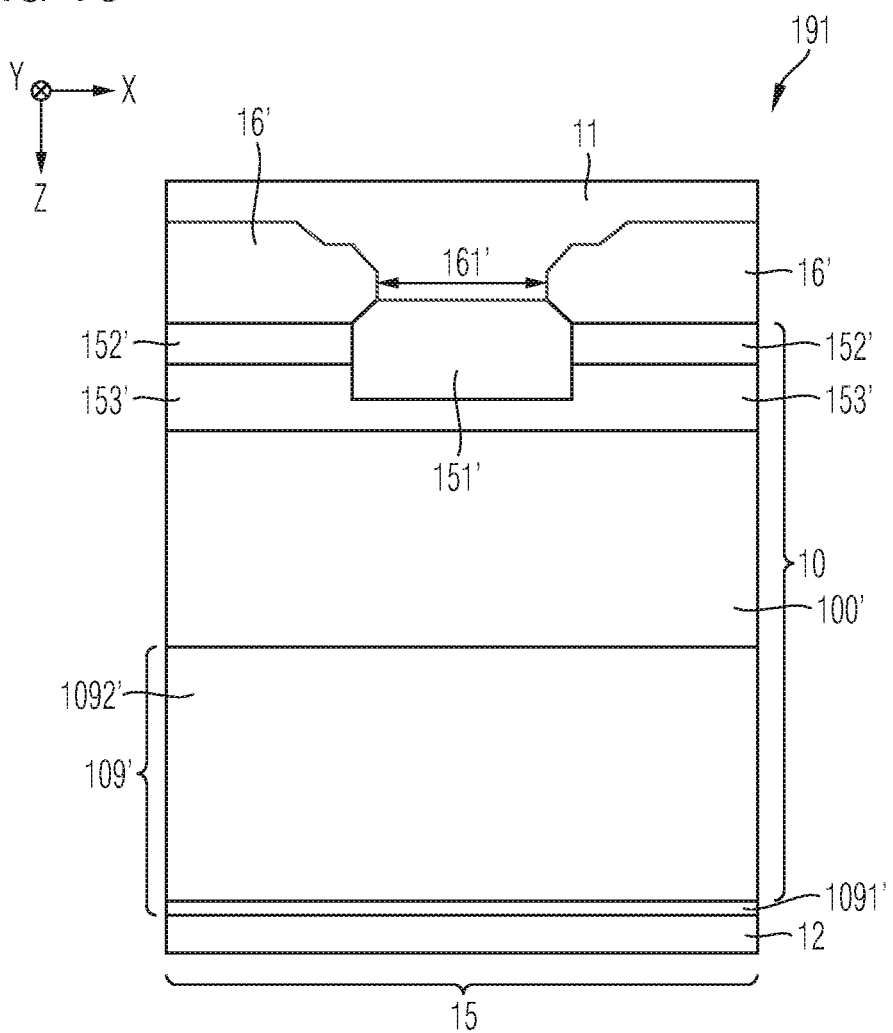
FIGS. 10-11 each schematically and exemplarily illustrate a section of a vertical cross-section of a power semiconductor device in accordance with some embodiments.
Figure 11:
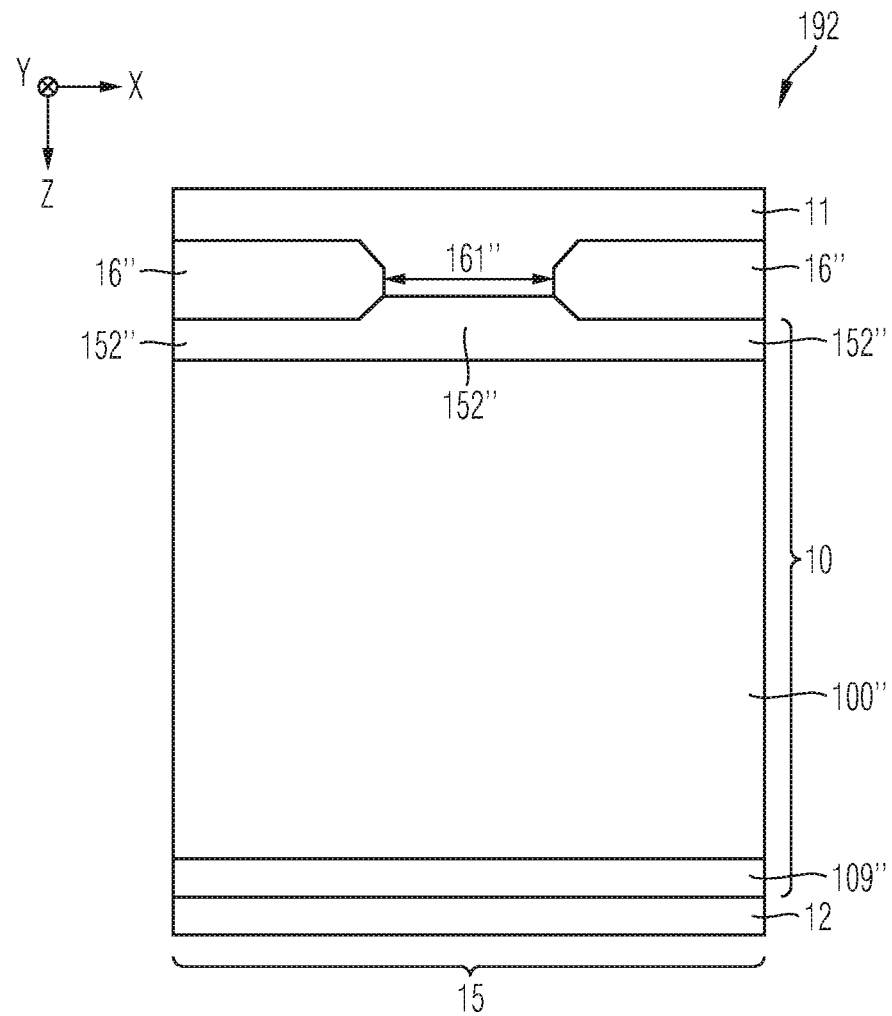

FIG. 9 schematically and exemplarily illustrates a section of a horizontal projection of an embodiment of the overvoltage protection power semiconductor chip 1, and FIGS. 10-11 each schematically and exemplarily illustrate a section of a vertical cross-section of an overvoltage protection power semiconductor chip 1 in accordance with some embodiments.

For example, the chip 1 may not only include said breakthrough cells 15, but also one or more first type auxiliary cells 191 and/or one or more second type auxiliary cells 192. An example of the first type auxiliary cell 191 is schematically illustrated in FIG. 10, and an example of a second type auxiliary cell 192 is schematically illustrated in FIG. 11.

For example, the chip 1 may include a plurality of second type auxiliary cells 192. The second type auxiliary cells 192 may be arranged in a transition region between the active region 1-1 and the inactive edge region 1-2, as schematically illustrated in FIG. 9, e.g., so as to surround the active region 1-1. Further, the second type auxiliary cells 192 may also be included in the active region 1-1. For example, the number of second type auxiliary cells 192 included within the active region 1-1 may be within the range from zero to the number of breakthrough cells 15. For example, in the active region 1-1, the number of breakthrough cells 15 is greater than the number of second type auxiliary cells 192.

In addition, there may be included one or more first type auxiliary cells 191 in the active region 1-1, in accordance with an embodiment.

The first type auxiliary cell 191 may exhibit similar configuration as the breakthrough cells 15, the difference including an optional greater extension of the doped contact region (reference numeral 109' in FIG. 10). In accordance with the embodiment illustrated in FIG. 10, the first type auxiliary cell 191 may include an insulation structure 16' arranged at the frontside and having a recess 161' into which the first load terminal 11 extends and interfaces with the semiconductor body 10; a drift region 100' having dopants of the first conductivity type; an anode region 151' having dopants of the second conductivity type and being electrically connected to the first load terminal 11; a first barrier region 152' having dopants of the second conductivity type at a lower dopant concentration than the anode region 151' and arranged in contact with each of the anode region 151' and the insulation structure 16; and a second barrier region 153' having dopants of the first conductivity type at a higher dopant concentration than the drift region 100' and separating both the anode region 151' and at least a part of the first barrier region 152' from the drift region 100'; and a doped contact region 109' arranged in contact with the second load terminal 12, wherein the drift region 100' is positioned between the second barrier region 153' and the doped contact region 109', and wherein the doped contact region 109' extends into the semiconductor body 10 for up to 50% of the total thickness of the semiconductor body 10, e.g., for at least 20% of said total thickness. For example, such great extension of the doped contact region 109' may be substantially constituted by means of an extended field stop region 1092', as schematically illustrated in FIG. 10.

For example, the further extension in the extension direction Z of the field stop region 1092' of the first type auxiliary cell 191 as compared to the extension of the field stop region 1092 of the breakthrough cell 15 may allow for a lower reverse current that may come into being, as has been explained above, if the potential of the first load terminal 11 is greater than the potential of the second load terminal 12.

Now referring to FIG. 11, an exemplary configuration of the second type auxiliary cell 192 is explained. Each of the one or more second type auxiliary cells 192 may comprise: an insulation structure 16" arranged at the frontside and having a recess 161" into which the first load terminal 11 extends and interfaces with the semiconductor body 10; a drift region 100" having dopants of a first conductivity type; a first barrier region 152" having dopants of the second conductivity type and being electrically connected to the first load terminal 11; a doped contact region 109" arranged in contact with the second load terminal 12, wherein the drift region 100 is positioned between the first barrier region 152" and the doped contact region 109".

Thus, in comparison with the breakthrough cell 15, the second type auxiliary cell 192 does neither include an anode region nor a second barrier region the number of second type auxiliary cells 192. Rather, the first barrier region 152" of the second type auxiliary cell 192 interfaces directly with the first load terminal 11, i.e., without an anode region that has a greater dopant concentration than the first barrier region. On the other side, the first barrier region 152" of the second type auxiliary cell 192 interfaces directly with the drift region 100", i.e., without a second barrier region as it is included in the breakthrough cell 15.

In accordance with an embodiment, each of the one or more second type auxiliary cells 192 may be configured to operate as charge carrier drainage cell. This may provide for a lower reverse current, which provides for a drainage of holes, in accordance with an embodiment.

In an embodiment, such reverse current may occur if the chip 1 is operated with a potential at the first load terminal 11 that is higher than the potential of the second load terminal 12, i.e., during the reverse blocking state.

Regarding all three cell types 15, 191, 192, it should be noted that these may share a common drift region (100, 100', 100"), a common doped contact region (109, 109', 109") and a common first barrier region (102, 151', 151"), in accordance with an embodiment.

As has already been explained above, the chip 1 may be coupled to a power semiconductor transistor 2, e.g., in the manner as schematically and exemplarily illustrated by means of the equivalent circuit of FIG. 6, so as to protect the power semiconductor transistor 2 against an overvoltage, e.g., a transient overvoltage that may occur during the switching operation of the transistor 2. As it is known to the skilled person, a power semiconductor transistor may comprise a plurality of transistor cells that may be integrated on a common die.

Figure 12:
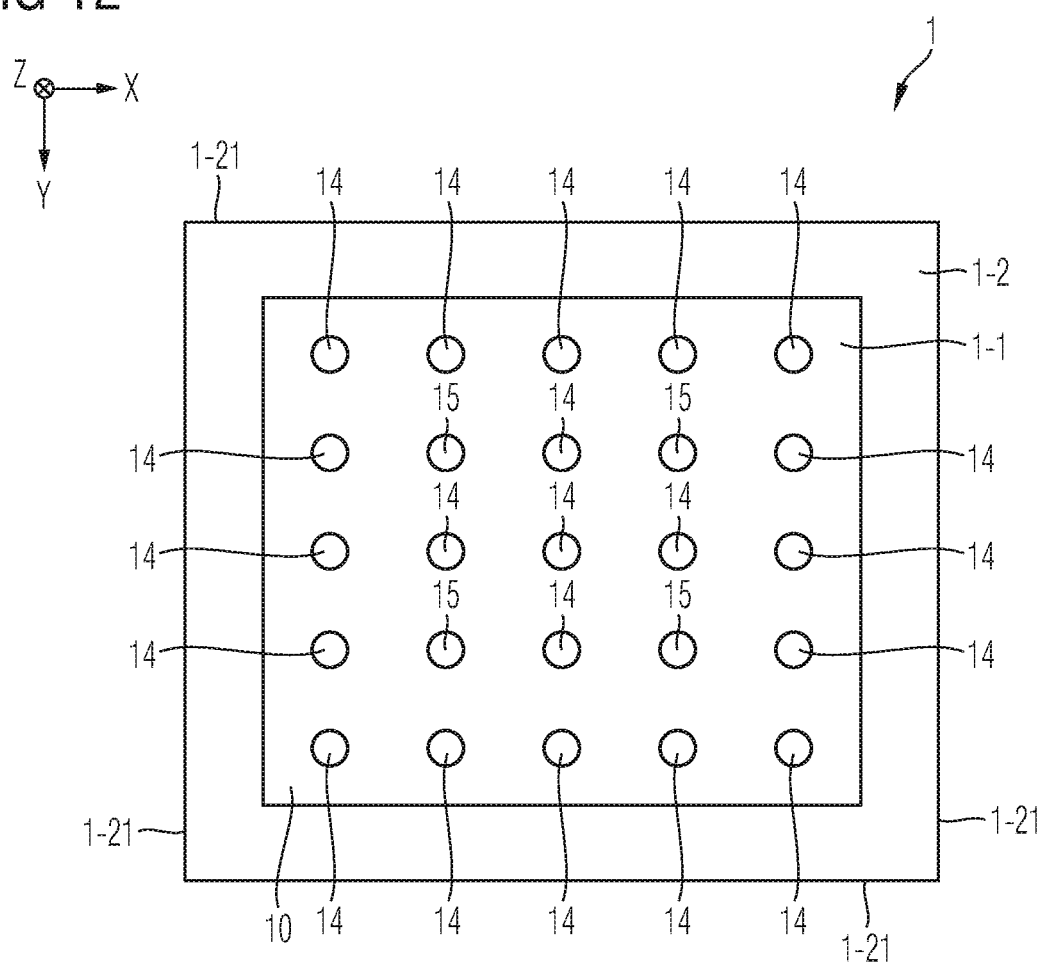
FIG. 12 schematically and exemplarily illustrates a section of a horizontal projection of a power semiconductor device in accordance with one or more embodiments.

Now referring to FIG. 12, which schematically and exemplarily illustrates a section of a horizontal projection of an embodiment of the overvoltage protection power semiconductor chip 1, for example, the transistor may comprise a plurality of transistor cells 14, wherein each of the transistor cells 14 may be integrated within the chip 1.

Figure 13:
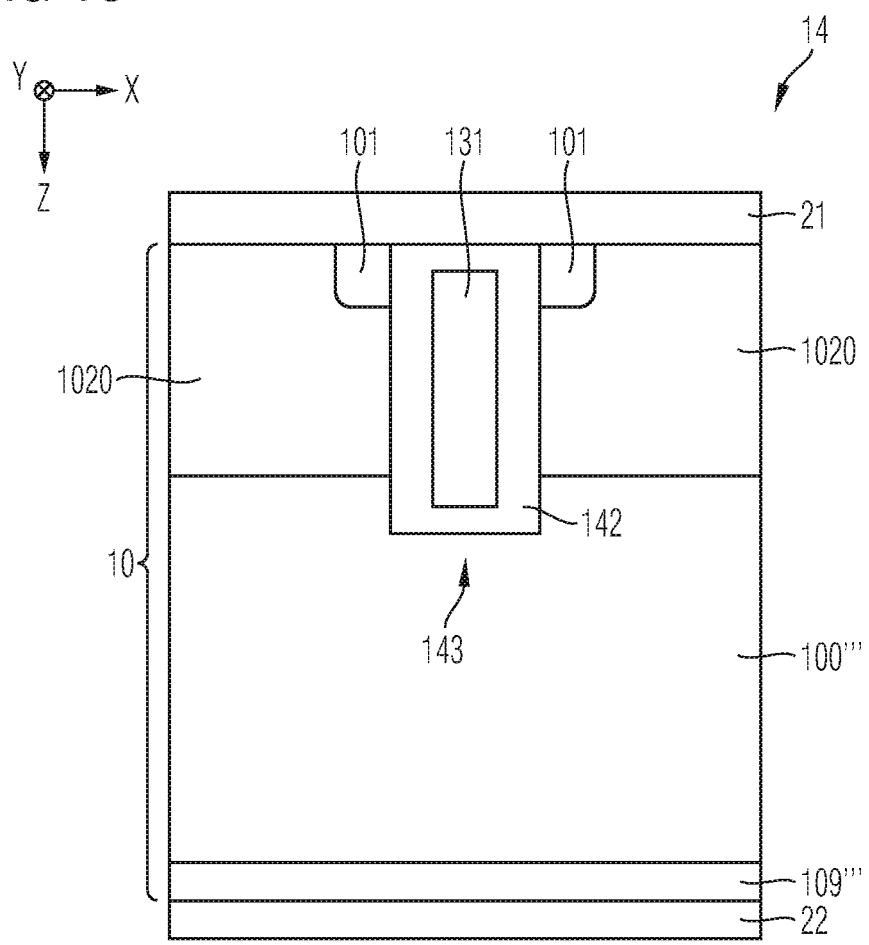
FIG. 13 schematically and exemplarily illustrates a section of a vertical cross-section of a transistor cell of a power semiconductor transistor in accordance with one or more embodiments.

It shall be noted that even though the reference numeral 14 is employed for the transistor cells 14 of the chip 1 of FIG. 12, these transistor cells 14 (as also illustrated in FIG. 13) typically do not comprises the recombination zone 159 as illustrated in FIGS. 17A-19A. Whereas this option is not excluded, the recombination zones 159 of the chip 1 of FIG. 12 are rather included in said breakthrough cells 15.

A section of a vertical cross-section of a transistor cell 14 of an embodiment of a power semiconductor transistor 2 is schematically and exemplarily illustrated in FIG. 13. Accordingly, each of the transistor cells 14 may comprise: a source region 101 having dopants of the first conductivity type and being electrically connected to an emitter terminal 21; a drift region 100''' having dopants of the first conductivity type; a body region 1020 having dopants of the second conductivity type and being electrically connected to the emitter terminal 21 and isolating the source region 101 from the drift region 100; an insulated gate electrode 131 configured to control the transistor cell 14; and a doped contact region 109''' electrically connected to the collector terminal 22 and having dopants of the second conductivity type. The doped contact region 109''' of the transistor cell 14 may comprise an emitter (not illustrated) electrically connected to the collector terminal 22 and a field stop region (not illustrated), e.g., configured in a manner as exemplarily explained with the respect to the emitter region 1091 and the field stop region 1092 further above.

However, it shall be understood that the present specification is not limited to any specific kind of a configuration of the transistor cell 14. For example, in FIG. 13, the transistor cell 14 exhibits a trench gate IGBT configuration where the gate electrode 131 is included in a trench and isolated by means of a trench insulator 142, but, in another embodiment, the transistor cell 14 may also exhibit a planar gate electrode, for example.

FIG. 14 schematically and exemplarily illustrates a section of a vertical cross-section of an embodiment of the overvoltage protection power semiconductor chip 1 that includes one or more transistor cells 14, e.g., as also illustrated in FIG. 12. Thus, the semiconductor body 10, e.g., a monolithic semiconductor body 10, is shared by each of the breakthrough cells 15 and the transistor cells 14. Each of the breakthrough cells 15 and the transistor cells 14 may be arranged within the active region 1-1 of the chip 1, and, further, the inactive region 1-2 may exhibit a greater breakthrough voltage as compared to the nominal chip blocking voltage, which may allow for ensuring that an eventual breakthrough takes place within the active region 1-1 and not within the inactive region 1-2, as has already been elucidated above.

In an embodiment, the first load terminal 11 of the breakthrough cells 15 and the emitter terminal 21 may be electrically connected to each other, e.g., by means of a common frontside metallization. For example, this may allow for realizing a direct clamping functionality, e.g., by temporarily short-circuiting the collector terminal 22 with the emitter terminal 21 by means of the breakthrough cells 15.

In addition, a backside metallization of the chip 1 may form each of the second load terminal 12 for the breakthrough cells 15 and the collector terminal 22 for the transistor cells 14. The doped contact region 109 that may include said emitter 1091 and said field stop region 1092 may also be shared by each of the breakthrough cells 15 and the doped contact region 109. In other words, the doped contact regions 109 of the breakthrough cells 15 and the doped contact regions 109''' of the transistor cells 14 can form a contiguous contact layer within the semiconductor body 10. Thus, the breakthrough cells 15 and the transistor cells 14 may exhibit an equally configured backside structure. Further, in an embodiment, the drift regions 100 of the breakthrough cells 15 and the drift regions 100''' of the transistor cells 14 may form a contiguous drift layer within the semiconductor body 10. On the frontside of the chip, the terminals may be coupled to each other as already schematically illustrated in FIG. 6. Accordingly, the emitter terminal 21 and the first load terminal 11 may be electrically insulated from each other or, respectively, in another embodiment said diode structure 17 may be provided as has been explained with respect to FIG. 8. However, the first load terminal 11 may be electrically connected to a gate terminal of the chip 1, and may thus be electrically connected to the gate electrode 131. In another embodiment, the first load terminal 11 of the chip 1 and the gate terminal 23 that is electrically connected to the gate electrode 131 may be separated and electrically insulated from each other, as has also already been explained above. Thus, it shall again be emphasized that the first load terminal 11 that is electrically connected to the anode regions 102 of the breakthrough cells 15 must not necessarily be electrically connected or electrically coupled to the gate terminal (cf. reference numeral 23 in FIG. 6), but may instead be electrically connected to another electrical potential, in accordance with an embodiment.

Figure 15A:
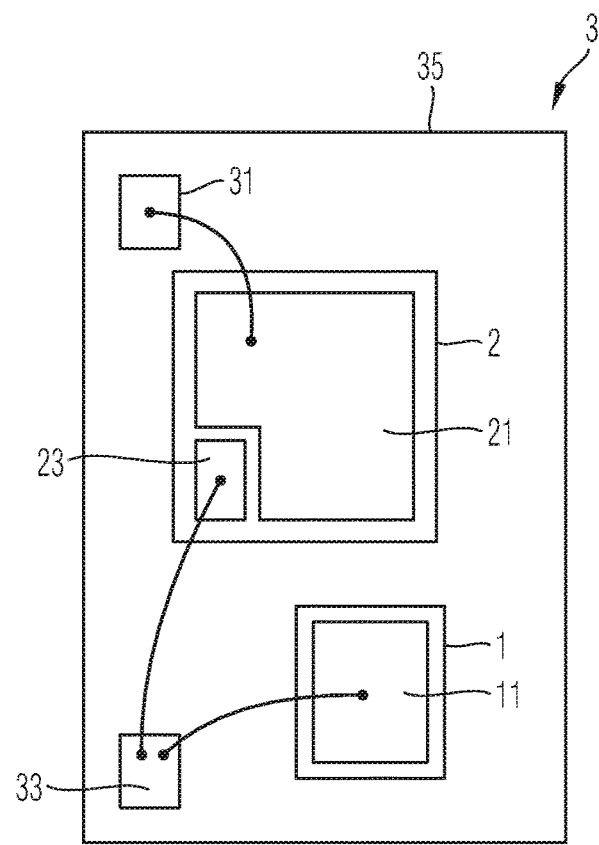
FIGS. 15A-15B each schematically and exemplarily illustrate a section of an integrated power semiconductor module comprising a power semiconductor transistor and a power semiconductor device in accordance with some embodiments.
Figure 15B:
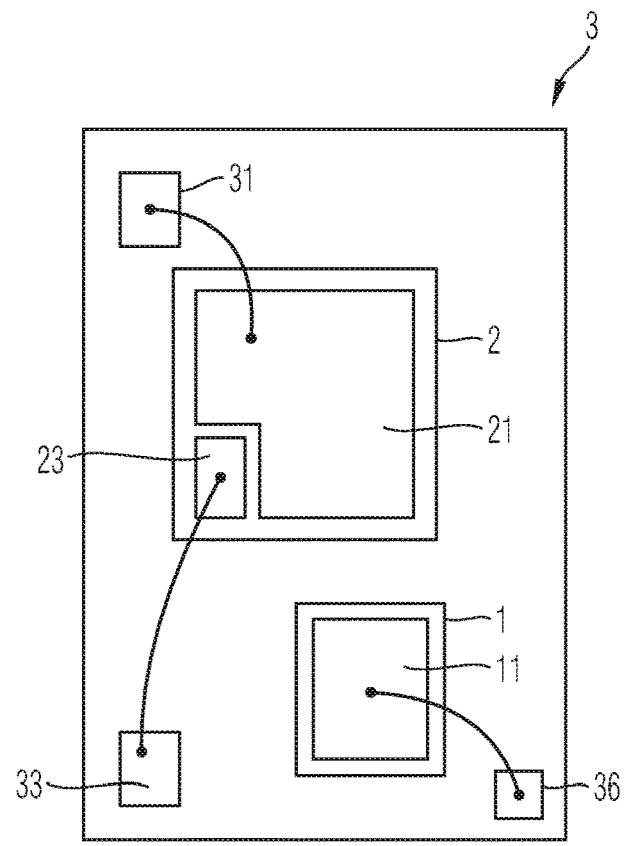

FIGS. 15A-B each schematically and exemplarily illustrate a section of an integrated power semiconductor module 3 comprising an embodiment of the power semiconductor transistor 2 and an embodiment of the overvoltage protection power semiconductor chip 1. Regarding exemplary configurations of the chip 1 and of the transistor 2, it is referred to the above.

In contrast with the embodiment schematically illustrated in FIGS. 12 and 14, in accordance with the embodiments illustrated in FIGS. 15A-B, the transistor 2 and the chip 1 are not integrated on a monolithic die, but on at least two separate dies. Nevertheless, the chip 1 and transistor 2 may be commonly packed within a shared package 35. Thus, in accordance with an embodiment, the integrated power semiconductor module 3 comprising the transistor 2 and the chip 1 can be provided as a single piece device.

Within the shared package 35, there may be provided a backside load terminal (not visible in FIGS. 15A-B) that may form each of the second load terminal 12 of the chip 1 and the collector terminal 22 of the transistor 2. Thus, these two terminals 12 and 22 may exhibit the same electrical potential. Further, the package 35 may include a frontside load terminal 31 that may be electrically connected to the emitter terminal 21 of the transistor 2. In addition, there may be a package control terminal 33 electrically connected to the gate terminal 23 of the transistor 2, e.g., for providing a control signal to the gate terminal 23.

In accordance with the embodiment illustrated in FIG. 15A, the package control terminal 33 may simultaneously be electrically connected to the first load terminal 11 of the chip 1; i.e., the gate terminal 23 and the first load terminal 11 may exhibit the same electrical potential. Thus, the first load terminal 11 of the chip 1 would also "see" the same gate signal as the gate terminal 23 of the transistor 2.

In accordance with the embodiment schematically illustrated in FIG. 15B, these two electrical potentials are not short-circuited, but the package control terminal 33 is only electrically connected to the gate terminal 23 of the transistor 2, and a separate package terminal 36 is provided that is electrically connected to the first load terminal 11, e.g., so as to control operation of the chip 1, i.e., of the breakthrough cells 15 included therein, independently from controlling the transistor 2.

In an embodiment of the module 3, each breakthrough cell 15 of the chip 1 may be configured to remain in a non-conducting state if the voltage between the load terminals 11, 12 is below a nominal chip blocking voltage and to adopt a conducting breakthrough state if the voltage between the load terminals 11, 12 is above the nominal chip blocking voltage, wherein the nominal chip blocking voltage can be lower than the nominal transistor blocking voltage. For example, during switching operation of the transistor 2, the chip 1 may be configured to implement at least one of an active clamping or a conditional active clamping functionality.

Referring to all embodiments described herein, the nominal chip blocking voltage can be equal to or greater than 600 V, greater than 3000 V, or even greater than 8000 V.

Figure 16:
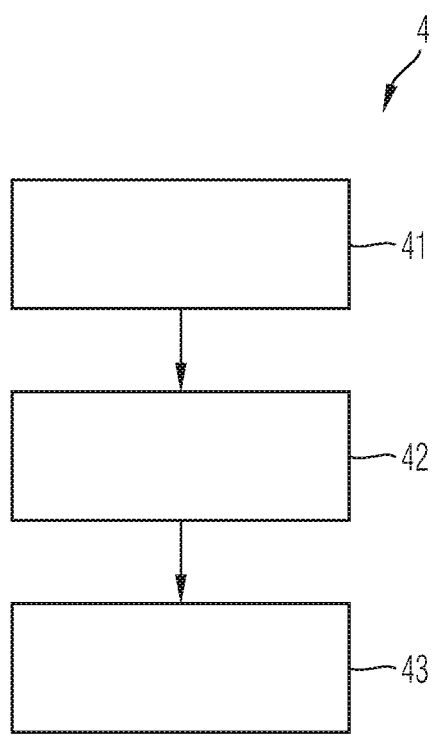
FIG. 16 schematically and exemplarily illustrates steps of a method of processing a power semiconductor device in accordance with one or more embodiments.

FIG. 16 schematically and exemplarily illustrates steps of a method 4 of processing an overvoltage protection power semiconductor chip 1 in accordance with one or more embodiments.

For example, method 4 comprises: Providing, in step 41, a semiconductor body 10 to be coupled to a first load terminal 11 and a second load terminal 12 of the chip 1, the first load terminal 11 to be arranged at a frontside and the second load terminal 12 to be arranged at a backside of the chip 1, and wherein the semiconductor body 10 comprises each of an active region 1-1 and an inactive edge region 1-2 that surrounds the active region 1-1.

Method 4 may further comprise, in step 42: Forming 42, in the active region 1-1, a plurality of breakthrough cells 15, each breakthrough cell 15 comprising an insulation structure 16 arranged at the frontside and having a recess 161 into which the first load terminal 11 is to extend and to interface with the semiconductor body 10.

Method 4 may further comprise, in step 43: Forming the following: a drift region 100 having dopants of a first conductivity type; an first doped region 102 having dopants of a second conductivity type and being electrically connected to the first load terminal 11; a first barrier region 152 having dopants of the second conductivity type at a lower dopant concentration than the first doped region 102 and arranged in contact with each of the first doped region 102 and the insulation structure 16; and a second barrier region 153 having dopants of the first conductivity type at a higher dopant concentration than the drift region 100 and separating both the first doped region 102 and at least a part of the first barrier region 152 from the drift region 100; and a doped contact region 109 arranged in contact with the second load terminal 12, wherein the drift region 100 is positioned between the second barrier region 153 and the doped contact region 109.

It shall be understood that exemplary embodiments of the method 4 may correspond to the exemplary embodiments of the chip 1 that have been described above.

For example, at least one of forming the first doped region 102, forming the first barrier region 152 and forming the second barrier region 153 includes carrying out at least one implantation processing step. In an embodiment, each of the first doped region 102, the first barrier region 152 and the second barrier region 153 are formed by a respective implantation processing step. Further, at least one of the one or more implantation processing steps can be carried out with an ion energy of at least 1.5 MeV.

In a further embodiment, method 4 may include forming a recombination zone 159 that extends into at least the first doped region 102 by carrying out a self-adjusted process using the insulation structure 16 as a mask. Regarding this aspect, it is referred to the explanations provided above, e.g., with respect to FIG. 2B where the recombination zone 159 has been described and also the way of producing such recombination zone 159.

In the above, embodiments pertaining to power semiconductor switches and corresponding processing methods were explained. For example, these semiconductor devices are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor switches applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

In a first exemplary subgroup of embodiments, where "exemplary" means serving as an example, the power semiconductor device is embodied as a power semiconductor switch.

In a second exemplary subgroup of embodiments, the power semiconductor device is embodied as an overvoltage protection power semiconductor chip or as an integrated power semiconductor module. Regarding the overvoltage protection power semiconductor chip or, respectively, the integrated power semiconductor module, it shall be understood that these devices may optionally include said recombination zone. However, as presented herein, there are also embodiments of the overvoltage protection power semiconductor chip or, respectively, the integrated power semiconductor module, which are not necessarily equipped with the recombination zone.

Regarding these exemplary complexes of embodiments, a few examples are presented below.

Examples of the First Exemplary Subgroup of Embodiments, Wherein the Power Semiconductor Device is Embodied as a Power Semiconductor Switch, and Examples of Corresponding Methods:

1. A power semiconductor switch, including a semiconductor body coupled to a first load terminal and a second load terminal, and including: a drift region with dopants of a first conductivity type; a source region with dopants of the first conductivity type and electrically connected to the first load terminal; and a first doped region implemented as a body region and with dopants of a second conductivity type and separating the source region from the drift region, wherein the drift region, the source region and the body region enable the power semiconductor switch to be operated in: a conducting state during which a load current between the terminals is conducted along a forward direction; in a forward blocking state during which a forward voltage applied between the terminals is blocked; and in a reverse blocking state during which a reverse voltage applied between the terminals is blocked; and the power semiconductor switch includes a damage zone and arranged at least within the body region.

2. The power semiconductor switch of example 1, wherein the recombination zone is configured to reduce at least one of a lifetime and a mobility of charge carriers present within the recombination zone.

3. The power semiconductor switch of example 1 or 2, wherein the recombination zone is laterally structured.

4. The power semiconductor switch of example 3, further including an active region with a plurality of transistor cells, wherein the recombination zone is laterally structured in that:
only each of a share of the plurality of transistor cells includes the recombination zone; and/or
the recombination zone is laterally structured within a horizontal cross-section of at least one of the plurality of the transistor cells.

5. The power semiconductor switch of one of the preceding examples, further configured to induce a conduction channel within the body region for conduction of at least a part of the load current during the conducting state, wherein the induced conduction channel and the recombination zone are spatially separated from each other.

6. The power semiconductor switch of example 5, wherein a minimum distance between the recombination zone and the induced conduction channel amounts to at least 50 nm.

7. The power semiconductor switch of one of the preceding examples, wherein the recombination zone extends into the source region.

8. The power semiconductor switch of one of the preceding examples, wherein the recombination zone does not extend into the drift region.

9. The power semiconductor switch of example 8, wherein the recombination zone exhibits a crystal defect concentration at least 1000 times greater than a crystal defect concentration within the drift region.

10. The power semiconductor switch of one of the preceding examples, wherein the body region extends deeper into the semiconductor body than the recombination zone.

11. The power semiconductor switch of one of the preceding examples, wherein the first load terminal includes a contact groove that interfaces with each of the source region and the body region, wherein the recombination zone laterally overlaps with the contact groove and exhibits lateral dimensions within the range of 60% to 200% of the lateral dimensions of the contact groove.

12. The power semiconductor switch of one of the preceding examples, including an active region with a plurality of transistor cells each configured to be operated in said conducting state, said forward blocking state and said reverse blocking state, and an inactive edge region surrounding the active region, wherein the recombination zone does not extend into the inactive edge region.

13. The power semiconductor switch of one of the preceding examples, wherein the recombination zone is spatially separated from a location of a peak of an electric field during the forward blocking state.

14. The power semiconductor switch of one of the preceding examples, wherein the recombination zone exhibits crystal defects that form a plurality of recombination centers within the recombination zone.

15. The power semiconductor switch of example 14, wherein the crystal defects are temperature-stable up to a temperature of at least 360°.

16. The power semiconductor switch of one of the preceding examples, wherein the recombination zone exhibits a crystal defect concentration that varies along at least a lateral direction by a factor of at least two.

17. The power semiconductor switch of one of the preceding examples, wherein the recombination zone exhibits a crystal defect concentration that varies along at least a vertical direction by a factor of at least two.

18. The power semiconductor switch of one of the preceding examples, wherein the body region exhibits a first subsection and a second subsection, the first subsection interfacing with the first load terminal and having a higher dopant concentration than the second subsection, the second subsection interfacing with the drift region, wherein the recombination zone extends into each of the first and second subsection.

19. The power semiconductor switch of examples 13 and 14, wherein a peak of the crystal defect concentration is located within an upper half of the second subsection or within a lower half of the first subsection of the body region.

20. The power semiconductor switch of one of the preceding examples, wherein the semiconductor body includes an emitter region being doped with dopants of the second conductivity type and being electrically connected with the second load terminal, wherein the semiconductor body interfaces with the second load terminal exclusively by means of the emitter region.

21. The power semiconductor switch of one of the preceding examples, wherein the semiconductor body further includes a field stop region, wherein the field stop region terminates the drift region and exhibits a proton-irradiation induced dopant concentration of dopants of the first conductivity type that is greater than the drift region dopant concentration.

22. A reverse blocking IGBT, including a laterally structured recombination zone implemented at least within a first doped region implemented as a body region of the reverse blocking IGBT.

23. A method of processing a power semiconductor switch, including:
  providing a semiconductor body to be coupled to a first load terminal and a second load terminal, and including: a drift region with dopants of a first conductivity type; a source region with dopants of the first conductivity type and electrically connected to the first load terminal; and a first doped region implemented as a body region and with dopants of a second conductivity type and separating the source region from the drift region, wherein the drift region, the source region and the body region enable the power semiconductor switch to be operated in: a conducting state during which a load current between the terminals is conducted along a forward direction; in a forward blocking state during which a forward voltage applied between the terminals is blocked; and in a reverse blocking state during which a reverse voltage applied between the terminals is blocked; and
  providing a recombination zone within the body region.

24. The method of example 23, wherein providing the recombination zone includes introducing crystal defects into the semiconductor body by means of at least one of an implantation processing step and a diffusion processing step.

25. The method of example 23 or 24, wherein providing the recombination zone involves carrying out a self-aligned processing step using a groove where each of the source region and the body region are to be contacted by the first load terminal.

Examples of the Second Exemplary Subgroup of Embodiments, Wherein the Power Semiconductor Device is Embodied as an Overvoltage Protection Power Semiconductor Chip or as an Integrated Power Semiconductor Module, and Examples of Corresponding Methods:

As indicated above, regarding the second exemplary subgroup of embodiments, the recombination zone may optionally be provided or not.

1. An overvoltage protection power semiconductor chip including a semiconductor body coupled to a first load terminal and a second load terminal of the chip, the first load terminal being arranged at a frontside and the second load terminal being arranged at a backside of the chip, and wherein the semiconductor body includes each of an active region and an inactive edge region that surrounds the active region, and wherein the active region includes a plurality of breakthrough cells, each breakthrough cell including:
  an insulation structure arranged at the frontside and having a recess into which the first load terminal extends and interfaces with the semiconductor body; and
  a drift region having dopants of a first conductivity type;
  a first doped region implemented as an anode region and having dopants of a second conductivity type and being electrically connected to the first load terminal;
  a first barrier region having dopants of the second conductivity type at a lower dopant concentration than the anode region and arranged in contact with each of the anode region and the insulation structure; and
  a second barrier region having dopants of the first conductivity type at a higher dopant concentration than the drift region and separating each of the anode region and at least a part of the first barrier region from the drift region;
  a doped contact region arranged in contact with the second load terminal, wherein the drift region is positioned between the second barrier region and the doped contact region.

2. The chip of example 1, wherein each breakthrough cell is configured to:
  remain in a non-conducting state if the voltage between the load terminals is below a nominal chip blocking voltage; and
  adopt to a conducting breakthrough state if the voltage between the load terminals is above the nominal chip blocking voltage.

3. The chip of example 2, wherein the chip is coupled to a power semiconductor transistor, and wherein each of the breakthrough cells are configured for a nominal chip blocking voltage that has been determined in dependence of a nominal blocking voltage of the transistor.

4. The chip (1) of one of the preceding examples, wherein each breakthrough cell includes a recombination zone that extends into at least the first doped region.

5. The chip of example 4, wherein the recombination zone provides a locally decreased charge carrier lifetime.

6. The chip of one of the preceding examples, wherein the anode region extends deeper into the semiconductor body than the first barrier region, and wherein a step formed due to the difference in depth level is covered by the second semiconductor barrier region.

7. The chip of one of the preceding examples, wherein the first barrier regions of the breakthrough cells form a contiguous semiconductor layer.

8. The chip of one of the preceding examples, wherein the breakthrough cells are arranged within the active region in accordance with a hexagonal tessellation pattern.

9. The chip of one of the preceding examples, wherein, in each of the breakthrough cells, the anode region, the first barrier region and the second barrier region are arranged symmetrically with respect to a fictitious vertical axis traversing the respective breakthrough cell.

10. The chip of one of the preceding examples, wherein the dopants present in each of the anode region, the first barrier region and the second barrier region are implanted dopants.

11. The chip of one of the preceding examples, wherein a transition between the second load terminal and the doped contact region forms a Schottky-contact.

12. The chip of one of the preceding examples, wherein the doped contact region includes an emitter with dopants of the second conductivity type and a field stop region with dopants of the first conductivity type, the emitter being electrically connected to the second load terminal and the field stop region arranged between the drift region and the emitter.

13. The chip of one of the preceding examples, further including a diode arrangement arranged at the frontside and external of the semiconductor body, wherein the diode arrangement laterally overlaps with the inactive edge region and is connected to the first load terminal and to a further terminal.

14. The chip of example 13, wherein the further terminal is electrically connected to an emitter terminal of a power semiconductor transistor.

15. The chip of one of the preceding examples, wherein the inactive edge region exhibits a greater breakdown voltage than each of the breakthrough cells.

16. The chip of one of the preceding examples, further including one or more first type auxiliary cells, wherein each of the one or more first type auxiliary cells includes:
an insulation structure arranged at the frontside and having a recess into which the first load terminal extends and interfaces with the semiconductor body; and
a drift region having dopants of the first conductivity type;
an anode region having dopants of the second conductivity type and being electrically connected to the first load terminal;
a first barrier region having dopants of the second conductivity type at a lower dopant concentration than the anode region and arranged in contact with each of the anode region and the insulation structure; and
a second barrier region having dopants of the first conductivity type at a higher dopant concentration than the drift region and separating each of the anode region and at least a part of the first barrier region from the drift region; and
a doped contact region arranged in contact with the second load terminal, wherein the drift region is positioned between the second barrier region and the doped contact region, and wherein the doped contact region extends into the semiconductor body for up to 50% of the total thickness of the semiconductor body.

17. The chip of one of the preceding examples, further including one ore more second type auxiliary cells, wherein each of the one or more second type auxiliary cells includes:
an insulation structure arranged at the frontside and having a recess into which the first load terminal extends and interfaces with the semiconductor body; and a drift region having dopants of a first conductivity type;
a first barrier region having dopants of the second conductivity type and being electrically connected to the first load terminal;
a doped contact region arranged in contact with the second load terminal, wherein the drift region is positioned between the first barrier region and the doped contact region.

18. The chip of one of the preceding examples, wherein the chip is coupled to a power semiconductor transistor, the transistor including a plurality of transistor cells, and wherein each of the transistor cells is integrated within the chip.

19. The chip of example 18, wherein each of the transistor cells includes:
a source region having dopants of the first conductivity type and being electrically connected to an emitter terminal;
a drift region having dopants of the first conductivity type;
a body region having dopants of the second conductivity type and being electrically connected to the emitter terminal and isolating the source region from the drift region;
an insulated gate electrode configured to control the transistor cell; and
a doped contact region electrically connected to the second load terminal and having dopants of the second conductivity type.

20. The chip of example 18 or 19, wherein the doped contact regions of the breakthrough cells and the doped contact regions of the transistor cells form a doped contact layer within the semiconductor body.

21. An integrated power semiconductor module including a power semiconductor transistor and an overvoltage protection power semiconductor chip, wherein the overvoltage protection power semiconductor chip includes a semiconductor body coupled to a first load terminal and a second load terminal of the chip, the first load terminal being arranged at a frontside and the second load terminal being arranged at a backside of the chip, and wherein the semiconductor body includes each of an active region and an inactive edge region that surrounds the active region, and wherein the active region includes a plurality of breakthrough cells;
wherein each breakthrough cell includes:
an insulation structure arranged at the frontside and having a recess into which the first load terminal extends and interfaces with the semiconductor body; and
a drift region having dopants of a first conductivity type;
a first doped region implemented as an anode region and having dopants of a second conductivity type and being electrically connected to the first load terminal;
a first barrier region having dopants of the second conductivity type at a lower dopant concentration than the anode region and arranged in contact with each of the anode region and the insulation structure; and
a second barrier region having dopants of the first conductivity type at a higher dopant concentration than the drift region and separating each of the anode region and at least a part of the first barrier region from the drift region; and
a doped contact region arranged in contact with the second load terminal, wherein the drift region is positioned between the second barrier region and the doped contact region;

wherein the transistor includes an emitter terminal, a collector terminal and a gate terminal, the collector terminal being electrically connected to the second load terminal of the chip.

22. A method of processing an overvoltage protection power semiconductor chip, including:
providing a semiconductor body to be coupled to a first load terminal and a second load terminal of the chip, the first load terminal to be arranged at a frontside and the second load terminal to be arranged at a backside of the chip, and wherein the semiconductor body includes each of an active region and an inactive edge region that surrounds the active region,
forming, in the active region a plurality of breakthrough cells, each breakthrough cell including an insulation structure arranged at the frontside and having a recess into which the first load terminal is to extend and to interface with the semiconductor body; and
forming the following regions:
a drift region having dopants of a first conductivity type;
a first doped region implemented as an anode region having dopants of a second conductivity type and being electrically connected to the first load terminal;
a first barrier region having dopants of the second conductivity type at a lower dopant concentration than the anode region and arranged in contact with each of the anode region and the insulation structure; and
a second barrier region having dopants of the first conductivity type at a higher dopant concentration than the drift region and separating each of the anode region and at least a part of the first barrier region from the drift region;
a doped contact region arranged in contact with the second load terminal, wherein the drift region is positioned between the second barrier region and the doped contact region.

The method of example 22, wherein at least one of forming the anode region, forming the first barrier region and forming the second barrier region includes carrying out at least one implantation processing step.

The method of example 23, wherein at least one of the one or more implantation processing steps is carried out with an ion energy of at least 1.5 MeV.

The method of one of the preceding examples 22 to 24, further including forming a recombination zone that extends into at least the anode region by carrying out a self-adjusted process using the insulation structure as a mask.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. An overvoltage protection power semiconductor chip comprising a semiconductor body coupled to a first load terminal and a second load terminal of the overvoltage protection power semiconductor chip, the first load terminal being arranged at a frontside and the second load terminal being arranged at a backside of the overvoltage protection power semiconductor chip, and wherein the semiconductor body comprises each of an active region and an inactive edge region that surrounds the active region, and wherein the active region comprises a plurality of breakthrough cells, each of the plurality of breakthrough cells comprises:

an insulation structure arranged at the frontside and having a recess into which the first load terminal extends and interfaces with the semiconductor body;
a drift region having dopants of a first conductivity type;
an anode region having dopants of a second conductivity type, the anode region being electrically connected to the first load terminal and disposed in contact with the first load terminal;
a first barrier region having dopants of the second conductivity type at a lower dopant concentration than the anode region and arranged in contact with each of the anode region and the insulation structure, wherein the first barrier region of the plurality of breakthrough cells forms a contiguous semiconductor layer;
a second barrier region having dopants of the first conductivity type at a higher dopant concentration than the drift region and separating each of the anode region and at least a part of the first barrier region from the drift region; and
a doped contact region arranged in contact with the second load terminal, wherein the drift region is positioned between the second barrier region and the doped contact region.

2. The overvoltage protection power semiconductor chip of claim 1, wherein each breakthrough cell is configured to:
remain in a non-conducting state if the voltage between the load terminals is below a nominal chip blocking voltage; and
adopt to a conducting breakthrough state if the voltage between the load terminals is above the nominal chip blocking voltage.

3. The overvoltage protection power semiconductor chip of claim 2, wherein the chip is coupled to a power semiconductor transistor, and wherein each of the plurality of breakthrough cells is configured for a nominal chip blocking voltage that has been determined in dependence of a nominal blocking voltage of the power semiconductor transistor.

4. The overvoltage protection power semiconductor chip of claim 1, wherein each of the plurality of breakthrough cells comprises a recombination center that extends into at least the anode region.

5. The overvoltage protection power semiconductor chip of claim 4, wherein the recombination center provides a locally decreased charge carrier lifetime.

6. The overvoltage protection power semiconductor chip of claim 1, wherein the anode region and the first barrier region have a difference in a depth level such that the anode region extends deeper into the semiconductor body than the first barrier region forming a step, and wherein the step formed due to the difference in the depth level is covered by the second semiconductor barrier region.

7. The overvoltage protection power semiconductor chip of claim 1, wherein the plurality of breakthrough cells are arranged within the active region in accordance with a hexagonal tessellation pattern.

8. The overvoltage protection power semiconductor chip of claim 1, wherein, in each of the plurality of breakthrough cells, the anode region, the first barrier region, and the second barrier region are arranged symmetrically with respect to a fictitious vertical axis traversing a respective breakthrough cell.

9. The overvoltage protection power semiconductor chip of claim 1, wherein the dopants present in each anode region, the dopants present in each first barrier region, and the dopants present in each second barrier region are implanted dopants.

10. The overvoltage protection power semiconductor chip of claim 1, wherein a transition between the second load terminal and the doped contact region forms a Schottky contact.

11. The overvoltage protection power semiconductor chip of claim 1, wherein the doped contact region comprises an emitter with dopants of the second conductivity type and a field stop region with dopants of the first conductivity type, the emitter being electrically connected to the second load terminal and the field stop region arranged between the drift region and the emitter.

12. The overvoltage protection power semiconductor chip of claim 1, further comprising:
   a diode arrangement arranged at the frontside of the semiconductor body and external to the semiconductor body, wherein the diode arrangement laterally overlaps with the inactive edge region and is connected to the first load terminal and to a further terminal.

13. The overvoltage protection power semiconductor chip of claim 12, wherein the further terminal is electrically connected to an emitter terminal of a power semiconductor transistor.

14. The overvoltage protection power semiconductor chip of claim 1, wherein the inactive edge region exhibits a greater breakdown voltage than each of the plurality of breakthrough cells.

15. The overvoltage protection power semiconductor chip of claim 1, further comprising:
   one or more first type auxiliary cells, wherein each of the one or more first type auxiliary cells includes:
      a first auxiliary insulation structure arranged at the frontside and having a recess into which the first load terminal extends and which interfaces with the semiconductor body;
      a first auxiliary drift region having dopants of the first conductivity type;
      a first auxiliary anode region having dopants of the second conductivity type and being electrically connected to the first load terminal;
      a first auxiliary first barrier region having dopants of the second conductivity type at a lower dopant concentration than the first auxiliary anode region and arranged in contact with each of the first auxiliary anode region and the first auxiliary insulation structure;
      a first auxiliary second barrier region having dopants of the first conductivity type at a higher dopant concentration than the first auxiliary drift region and separating each of the first auxiliary anode region and at least a part of the auxiliary first barrier region from the first auxiliary drift region; and
      a first auxiliary doped contact region arranged in contact with the second load terminal, wherein the first auxiliary drift region is positioned between the first auxiliary second barrier region and the first auxiliary doped contact region, and wherein the first auxiliary doped contact region extends into the semiconductor body for up to 50% of a total thickness of the semiconductor body.

16. The overvoltage protection power semiconductor chip of claim 15, further comprising one or more second type auxiliary cells, wherein each of the one or more second type auxiliary cells comprises:
   a second auxiliary insulation structure arranged at the frontside and having a recess into which the first load terminal extends and interfaces with the semiconductor body; and
   a second auxiliary drift region having dopants of a first conductivity type;
   a second auxiliary first barrier region having dopants of the second conductivity type and being electrically connected to the first load terminal;
   a second auxiliary doped contact region arranged in contact with the second load terminal, wherein the second auxiliary drift region is positioned between the second auxiliary first barrier region and the second auxiliary doped contact region.

17. The overvoltage protection power semiconductor chip of claim 1, wherein the overvoltage protection power semiconductor chip is coupled to a power semiconductor transistor, the power semiconductor transistor comprising a plurality of transistor cells, and wherein each of the plurality of transistor cells is integrated within the overvoltage protection power semiconductor chip.

18. The overvoltage protection power semiconductor chip of claim 17, wherein each of the plurality of transistor cells comprises:
   a source region having dopants of the first conductivity type and being electrically connected to an emitter terminal;
   a further drift region having dopants of the first conductivity type;
   a channel region having dopants of the second conductivity type and being electrically connected to the emitter terminal and isolating the source region from the further drift region;
   an insulated gate electrode configured to control the transistor cell; and
   a further doped contact region electrically connected to the second load terminal and having dopants of the second conductivity type.

19. The overvoltage protection power semiconductor chip of claim 17, wherein the doped contact regions of the plurality of breakthrough cells and the further doped contact regions of the plurality of transistor cells form a doped contact layer within the semiconductor body.

20. An integrated power semiconductor module comprising a power semiconductor transistor and an overvoltage protection power semiconductor chip, wherein the overvoltage protection power semiconductor chip comprises a semiconductor body coupled to a first load terminal and a second load terminal of the overvoltage protection power semiconductor chip, the first load terminal being arranged at a frontside and the second load terminal being arranged at a backside of the overvoltage protection power semiconductor chip, and wherein the semiconductor body comprises each of an active region and an inactive edge region that surrounds the active region, and wherein the active region comprises a plurality of breakthrough cells; wherein each of the plurality of breakthrough cells comprises:
   an insulation structure arranged at the frontside and having a recess into which the first load terminal extends and interfaces with the semiconductor body;
   a drift region having dopants of a first conductivity type;
   an anode region having dopants of a second conductivity type, the anode region being electrically connected to the first load terminal and disposed in contact with the first load terminal;
   a first barrier region having dopants of the second conductivity type at a lower dopant concentration than the anode region and arranged in contact with each of the anode region and the insulation structure, wherein the first barrier region of the plurality of breakthrough cells forms a contiguous semiconductor layer;

a second barrier region having dopants of the first conductivity type at a higher dopant concentration than the drift region and separating each of the anode region and at least a part of the first barrier region from the drift region; and a doped contact region arranged in contact with the second load terminal, wherein the drift region is positioned between the second barrier region and the doped contact region;

wherein the transistor comprises an emitter terminal, a collector terminal and a gate terminal, the collector terminal being electrically connected to the second load terminal of the overvoltage protection power semiconductor chip.

* * * * *